(12) United States Patent
Lee et al.

(10) Patent No.: US 6,634,015 B2
(45) Date of Patent: Oct. 14, 2003

(54) COMPUTER-READABLE STORAGE MEDIA STORED WITH A DELAY LIBRARY FOR DESIGNING A SEMICONDUCTOR INTEGRATED CIRCUIT DEVICE

(75) Inventors: Peter Maurice Lee, Musashino (JP); Goichi Yokomizo, Nishitama (JP)

(73) Assignee: Hitachi, Ltd., Tokyo (JP)

( * ) Notice: Subject to any disclaimer, the term of this patent is extended or adjusted under 35 U.S.C. 154(b) by 22 days.

(21) Appl. No.: 09/800,479

(22) Filed: Mar. 8, 2001

(65) Prior Publication Data

US 2001/0029600 A1 Oct. 11, 2001

(30) Foreign Application Priority Data

Mar. 30, 2000 (JP) ........................... 2000-093608

(51) Int. Cl.[7] ................. G06F 17/50; G01R 31/26; H01L 21/66
(52) U.S. Cl. ................. 716/6; 716/2; 716/4; 438/14
(58) Field of Search ................. 716/6, 4, 2; 438/14

(56) References Cited

U.S. PATENT DOCUMENTS 5,974,247 A    10/1999   Yonezawa
6,541,285 B2 *   4/2003   Koike ................. 438/14

FOREIGN PATENT DOCUMENTS

JP    8-263540 A    10/1996
JP    11-135388 A    5/1999
JP    11-219380 A    8/1999

OTHER PUBLICATIONS

Yoshiyuki Kawakami et al., Gate–Level Aged Timing Simulation Methodology for Hot–Carrier Reliability Assurance, Proceedings of the ASP–DAC 2000, pp. 289–294, Jan. 2000.*

Yonezawa et al., "Ratio Based Hot–Carrier Degradation Modeling for Aged Timing Simulation of Millions of Transistors Digital Circuits," IEDM Technical Digest, Dec. 1998, pp. 93–96.

* cited by examiner

Primary Examiner—Matthew Smith
Assistant Examiner—A. M. Thompson

(57) ABSTRACT

The invention relates to a design system of logic products, which includes a time-consuming detailed simulation part and a fast whole-product simulation part. Two new parameters Ac and n are added to a delay library of the fast whole-product simulation part for the purpose of hot carrier degradation calculations (Degradation=Act$^n$) (wherein n is a slope of time dependence and depends on a bias voltage that the circuit configuration and cells receive, and Ac depends on the bias voltage that the circuit configuration and cells receive). Thereby, it is feasible to carry out optimization of the design by a fast whole-product simulation part without crossing the time-consuming detailed simulation part.

13 Claims, 25 Drawing Sheets

FIG. 7

| DEFINITION OF VARIOUS TYPES OF TIMINGS AND OTHER INFORMATION, WHICH ARE INCLUDED IN DELAY LIBRARIES | |
|---|---|
| TinTRAN | TRANSITION TIME OF INPUT SIGNAL, NORMALLY MEASURED FROM 10% THROUGH 90% OF MAXIMUM VOLTAGE |
| CL | ELECTROSTATIC CAPACITANCE ATTACHED TO AN OUTPUT |
| ToutRISE | OUTPUT SIGNAL RISE TRANSITION TIME, NORMALLY MEASURED FROM 10% THROUGH 90% OF MAXIMUM VOLTAGE |
| ToutFALL | OUTPUT SIGNAL FALL TRANSITION TIME, NORMALLY MEASURED FROM 90% THROUGH 10% OF MAXIMUM VOLTAGE |
| TpRISE | PROPAGATION DELAY IN OUTPUT RISE, WHERE NORMALLY MEASUREMENT IS PERFORMED FROM THE POINT WHEN AN INPUT SIGNAL REACHES 50% OF THE MAXIMUM VALUE TO THE POINT WHERE AN OUTPUT SIGNAL REACHES 50% OF THE MAXIMUM VALUE |
| TpFALL | PROPAGATION DELAY IN OUTPUT FALL, WHERE NORMALLY MEASUREMENT IS PERFORMED FROM THE POINT WHEN AN INPUT SIGNAL REACHES 50% OF THE MAXIMUM VALUE TO THE POINT WHERE AN OUTPUT SIGNAL REACHES 50% OF THE MAXIMUM VALUE |

FIG. 8

| DELAY LIBRARIES | | | | | |
|---|---|---|---|---|---|
| INPUT | CL | OUTPUT | | DELAY | |
| TinTRAN | | ToutRISE | ToutFALL | TpRISE | TpFALL |
| | | | | | |

INPUT PARAMETERS | OUTPUT PARAMETERS

| CL [F]<br>TinTRAN [sec] | 1.00E-14 | 2.50E-14 | 5.00E-14 | 7.50E-14 | 1.00E-13 |
|---|---|---|---|---|---|
| 1.00E-10 | 0.590997 | 1.02344 | 1.7422 | 2.4599 | 3.17852 |
| 2.50E-10 | 0.803509 | 1.29708 | 2.02759 | 2.76754 | 3.51205 |
| 5.00E-10 | 1.04821 | 1.6779 | 2.51364 | 3.26834 | 4.03409 |
| 7.50E-10 | 1.24996 | 1.97398 | 2.94787 | 3.77471 | 4.55695 |
| 1.00E-09 | 1.43315 | 2.23474 | 3.31377 | 4.16875 | 5.07743 |

| DELAY LIBRARIES | | | | | | | |
|---|---|---|---|---|---|---|---|
| INPUT | | OUTPUT | | DELAY | | | |
| TinTRAN | CL | ToutRISE | ToutFALL | TpRISE | TpFALL | Ac | n |
| | | | | | | | |

INPUT PARAMETERS | OUTPUT PARAMETERS

FIG. 14

| TinTRAN [sec] | CL [F] | Ac [1/yrs^n] | | n |
|---|---|---|---|---|
| | | CELL 1 | CELL 2 | |
| 1.00E-10 | 1.00E-14 | 2.3371E-02 | 5.4533E-02 | 0.4 |
| 1.00E-10 | 2.50E-14 | 2.4606E-02 | 5.7413E-02 | 0.4 |
| 1.00E-10 | 5.00E-14 | 2.5348E-02 | 5.9144E-02 | 0.4 |
| 1.00E-10 | 7.50E-14 | 2.5792E-02 | 6.0182E-02 | 0.4 |
| 1.00E-10 | 1.00E-13 | 2.6138E-02 | 6.0988E-02 | 0.4 |
| 2.50E-10 | 1.00E-14 | 2.3422E-02 | 5.4652E-02 | 0.4 |
| 2.50E-10 | 2.50E-14 | 2.6768E-02 | 6.2458E-02 | 0.4 |
| 2.50E-10 | 5.00E-14 | 2.9510E-02 | 6.8857E-02 | 0.4 |
| 2.50E-10 | 7.50E-14 | 3.1095E-02 | 7.2555E-02 | 0.4 |
| 2.50E-10 | 1.00E-13 | 3.2190E-02 | 7.5110E-02 | 0.4 |
| 5.00E-10 | 1.00E-14 | 2.4921E-02 | 5.8150E-02 | 0.4 |
| 5.00E-10 | 2.50E-14 | 2.8648E-02 | 6.6844E-02 | 0.4 |
| 5.00E-10 | 5.00E-14 | 3.2428E-02 | 7.5665E-02 | 0.4 |
| 5.00E-10 | 7.50E-14 | 3.4838E-02 | 8.1288E-02 | 0.4 |
| 5.00E-10 | 1.00E-13 | 3.6582E-02 | 8.5358E-02 | 0.4 |
| 7.50E-10 | 1.00E-14 | 2.6752E-02 | 6.2422E-02 | 0.4 |
| 7.50E-10 | 2.50E-14 | 3.0307E-02 | 7.0717E-02 | 0.4 |
| 7.50E-10 | 5.00E-14 | 3.4325E-02 | 8.0091E-02 | 0.4 |
| 7.50E-10 | 7.50E-14 | 3.7085E-02 | 8.6531E-02 | 0.4 |
| 7.50E-10 | 1.00E-13 | 3.9155E-02 | 9.1361E-02 | 0.4 |
| 1.00E-09 | 1.00E-14 | 2.8825E-02 | 6.7258E-02 | 0.4 |
| 1.00E-09 | 2.50E-14 | 3.1748E-02 | 7.4078E-02 | 0.4 |
| 1.00E-09 | 5.00E-14 | 3.5800E-02 | 8.3533E-02 | 0.4 |
| 1.00E-09 | 7.50E-14 | 3.8718E-02 | 9.0342E-02 | 0.4 |
| 1.00E-09 | 1.00E-13 | 4.0975E-02 | 9.5608E-02 | 0.4 |

| DELAY LIBRARIES | | | | | | | |
|---|---|---|---|---|---|---|---|
| INPUT | | OUTPUT | | DELAY | | | |
| TinTRAN | CL | ToutRISE | ToutFALL | TpRISE | TpFALL | β | n |
| | | | | | | | |

INPUT PARAMETERS ← → OUTPUT PARAMETERS

SIGNAL DIRECTION →

FIG. 28

SIGNAL DIRECTION ⟶

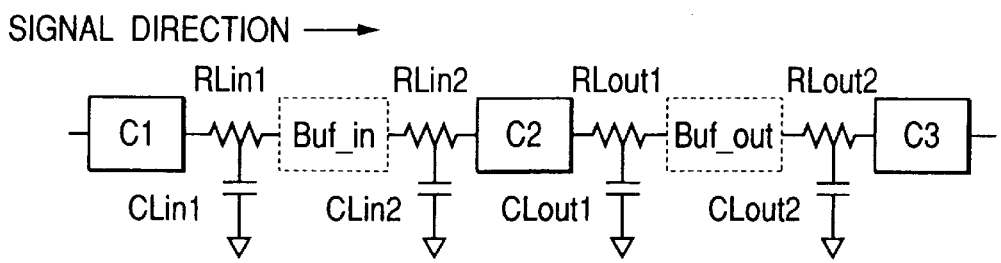

FIG. 29

| DESCRIPTION OF LEGENDS USED IN THE OPTIMIZING PROCESS OF PRODUCT DESIGN ||
|---|---|
| PRESENT CELL | CELL TO BE EVALUATED WITH RESPECT TO HOT CARRIER DEGRADATION |
| PRECEDING CELL | CELL LAY BEFORE THE CELL TO BE EVALUATED WITH RESPECT TO HOT CARRIER DEGRADATION |
| RF | RF COEFFICIENT OF THE PRESENT CELL |
| RFpre | RF COEFFICIENT OF THE CELL PRECEDING THE PRESENT CELL |
| Wg | GATE WIDTH OF THE TRANSISTOR RELATED TO THE PRESENT CELL |
| Lg | GATE LENGTH OF THE TRANSISTOR RELATED TO THE PRESENT CELL |
| Wgpre | GATE WIDTH OF THE TRANSISTOR RELATED TO THE PRECEDING CELL |
| Lgpre | GATE LENGTH OF THE TRANSISTOR RELATED TO THE PRECEDING CELL |
| td | PROPAGATION DELAY OF THE CRITICAL PATH |
| tdmax | MAXIMUM PERMISSIBLE PROPAGATION DELAY OF THE CRITICAL PATH |

COMPUTER-READABLE STORAGE MEDIA STORED WITH A DELAY LIBRARY FOR DESIGNING A SEMICONDUCTOR INTEGRATED CIRCUIT DEVICE

BACKGROUND OF THE INVENTION

The present invention relates to a technology for designing a semiconductor integrated circuit device, and in particular to a computer-readable storage medium that is preferable for optimization with respect to the reliability of designing logic products by a cell unit, using delay libraries having parameters to calculate degradation by hot carriers, and a technology that is effective to application of a method for designing a semiconductor integrated circuit device.

In prior arts, in designing semiconductor integrated circuit devices, the design has been automated and saved manpower by using computer software called CAD (Computer-Aided Design) and DA (Design Automation). The design of electric characteristics of logic circuits that constitute a semiconductor integrated circuit device has been optimized by verifying the operations of circuits that man developed, through simulation by using a CAD tool, which is called "Circuit Simulation". The electric characteristics to be optimized herein are mainly physical quantities directly pertaining to the performance of a semiconductor integrated circuit device such as delay time and power consumption, etc. But, in line with the recent progress of semiconductor integrated circuit devices, reliability design has been required with respect to the aged changes (that is, service life) of the semiconductor integrated circuit devices. As one of the representative examples of physical phenomenon regarding the service life of the semiconductor integrated circuit devices, characteristic degradation due to hot carriers may be listed.

A description is given of degradation due to the hot carriers with reference to FIG. 35 that is a view showing a saturation mode (Vds>Vdsat) in which an MOSFET transistor operates and FIG. 36 that is a characteristic view showing a decrease in a drain current. In line with the shrinking of a device dimension, the lateral field of channel area A of an NMOSFET device of FIG. 35 has gradually become higher and higher. By an increase in the lateral field, the channel electrons will acquire energy, and becomes so-called "hot electrons". These higher electrons can be injected into a gate oxide film or can cause impact ionization which produces electron-hole pairs, of which the electrons can also be injected into the gate oxide film. Electrons can also break bonds at the Si—SiO$_2$ interface, causing a possibility that the interface is impaired. In all these cases, if electrons become trapped in the oxide film or if electrons fill the interface states, drain current Ids decreases with respect to the drain voltage Vds as in FIG. 36, and device performance may be degraded.

Therefore, as technologies for designing semiconductor integrated circuit devices in which characteristic degradation due to hot carriers is taken into consideration, there are, for example, the literature of IEDM Technical Digest December, 1998, pp. 93 through 96, "Ratio Based Hot-Carrier Degradation Modeling for Aged Timing Simulation of Millions of Transistor Digital Circuits", U.S. Pat. No. 5,974,247, and Japanese Patent Laid-Open No. 135388/1999, and Japanese Patent Laid-Open No. 219380/1999.

In test literatures and publications, technologies pertaining to:

(a) A method for calculating degradation due to hot carriers in delay library levels;

(b) A method for calculating degradation due to hot carriers in library cell propagation delay on the basis of input signal transition time, and output signal transition time/load oriented to output-attached capacity; and (c) A method for calculating (b) based on a fluctuation in a power supply voltage and operating temperature are described.

SUMMARY OF THE INVENTION

However, the inventor examined the technologies disclosed in the above-described document and patent application publications, and the following was made clear. That is, in the technologies described in the above document and patent application publications, (1) Delay library/calculation is done for one degradation table entry with respect to only one circuit operation time, (2) Delay library/calculation is done only one time (one combination of duties and frequencies) with respect to one degradation table entry, and (3) Delay libraries and hot carrier libraries are separate from each other.

These are listed as problematic points.

Therefore, with respect to the above-described (1) through (3), the inventor takes the following into consideration:

(1') Parameters that describe the time dependence of degradation are contained in a delay library, and a single library necessary to describe the degradation with respect to different circuit operation times is determined, (2') Parameters that describe the time dependence of degradation are contained in a delay library, and a single library necessary to describe the degradation in an optional combination of duties and frequencies, and (3') Delay libraries and hot carrier libraries are merged into one library.

Thereby, if there is only one library per technology, the system does not require the repetition of the hot carrier degradation in terms of the circuit level with respect to different circuit operation frequencies.

Also, the design system and design flow, in which the reliability is taken, for optimizing the reliability and performance, which were enabled by the above-described literature and patent publications, are as shown in, for example, FIG. 37. In the design method, it is necessary to cross a time-consuming detailed simulation part 10 (that takes much time) and the whole-production simulation part 20 when performing the optimization of the design. The entire design optimization must be carried out by crossing the whole-product simulation part 20 to the time-consuming detailed simulation part 10 (that takes much time). That is, in the technologies described in the literature and patent application publications, it becomes necessary to re-produce the libraries where a design change (27a) occurs in line with topology, frequencies, signal paths, and circuit operating times, excepting the design change (27b) with respect to the power supply source and temperature.

It is therefore an object of the invention to provide a storage medium having adequate parameters in the design of semiconductor integrated circuit devices.

It is another object of the invention to provide a design technology of semiconductor integrated circuit devices that, when performing optimization of the design by using degradation information of parameters Ac and n, does not require crossing a time-consuming detailed simulation part (that takes much time) and the whole-product simulation part and is able to perform the design optimization in the whole-product simulation part in a design method for taking reliability in the design and optimizing the reliability and performance.

The above-described and other objects and novel features of the invention will be made more apparent through the description in the specification hereof and the accompanying drawings.

The representative factors of the inventive points of the present application are briefly described below.

That is, a computer-readable storage medium according to the invention includes, as delay libraries of various types of logic cells that constitute a logic product, input transition time (TinTRAN) of the respective logic cells, output capacitance (CL) of the respective logic cells, and output parameters including the parameters of degradation calculation of hot carriers of the respective logic cells, which are obtained by performing a circuit simulation using the transition time of input signal and capacitance attached to the output as input parameters.

In the computer-readable storage medium, the degradation D due to time dependence of the propagation delay of the respective logic cells has, as the first output parameters, Ac and n for which $D=\Delta tp/tp0=Ac \times t^n$ is established where the elapse time is t, the fresh delay quantity is tp0, and the aged delay quantity is $\Delta tp$, and Ac depends on the circuit configuration and a bias voltage which the logic cells receive, and the n is a slope of time dependence, which is a parameter dependent on the circuit configuration and a bias voltage that the logic cells receive.

In addition, the degradation D due to the time dependence of propagation delay of the respective logic cells has, as the second output parameters, $\beta$ and n for which $\log(D)=\log(Bc)+n\log(Dtft)$, or $\log(D)=\beta+n\log(Dtft)$ or $LogD=\log(D)=\beta+nLogF+nLogt+nLogDt$, $LogDt=\log(Dt)$ in which a frequency is established when $D=Ac \times (Dt \times f/f0 \times t)^n = Bc(Dt \times f \times t)^n$, $Bc=Ac/f0^n$, $f0=Ac$ and n are extracted, and the logarithm of both sides is taken, wherein the duty is Dt and frequency is f. The LogF is the logarithm of the frequency f, and Logt is the logarithm of the time t.

The above-described first and second output parameters further include propagation delay (TpRISE) when the output signal of respective logic cells rises, and propagation delay (TpFALL) when the output signal of respective logic cells falls, and further include a transition time (ToutRISE) when the output signal of respective logic cells rises, and a transition time (ToutFALL) when the output signal of respective logic cells falls, wherein these parameters are created in the form of a table.

Also, a method for designing the first semiconductor integrated circuit device according to the invention includes the steps of creating, when designing a logic product by a combination of various types of logic cells, a transition time (TinTRAN) of the input signal of the respective logic cells and an output capacitance (CL); a transition time (ToutRISE) when an output signal rises, and a transition time (ToutFALL) when an output signal falls, which are obtained as output parameters by performance of a circuit simulation by using the transition time of input signal and output capacitance as input parameters; propagation delay (TpRISE) when the output signal rises and propagation delay (TpFALL) when the output signal falls; and delay libraries in which parameters (Ac and n or $\beta$ and n) for degradation calculations of hot carriers; preparing a reference delay file by calculating propagation delays with respect to all the logic cells that constitute a logic product based on the library; and obtaining the overall propagation delays of the critical path in the logic product on the basis of the reference delay file as values of the propagation delays of the respective cells.

The method for designing the first semiconductor integrated circuit device further includes the steps of adding parameters of changes in temperature and changes in the power supply voltage to the delay libraries, and processing the parameters as an overall constant that does not require separate extraction thereof with respect to the respective logic cells and load conditions.

A method for designing the second semiconductor integrated circuit device according to the invention includes the steps of obtaining a reliability factory (RF) in the respective logic cells that constitute a logic product and reducing the reliability factor (RF) with respect to the logic cells having the reliability factor exceeding the necessity so that the reliability factor (RF) lies in a certain margin between the maximum reliability factor (RFup) and the minimum reliability factor (RFmin).

The method for designing the second semiconductor integrated circuit device further includes the step of increasing the reliability factor (RF) with respect to a logic cell, which does not meet the reliability requirement, of the respective logic cells so that it lies in a certain margin between the predetermined maximum reliability factor (RFup) and minimum reliability factor (RFmin).

The method for designing the second semiconductor integrated circuit device is featured in that, where the fresh delay quantity is tp0 and the aged delay quantity is $\Delta tp$, the reliability factor (RF) is expressed in terms of $RF=1/(sensitivity/degradation)$, $degradation=\Delta tp/tp0$ of the respective logic cells, $sensitivity(\Delta tp/tp0$ of the critical path of a logic product)/($\Delta tp/tp0$ of the respective logic cells).

The reliability factor can be varied by changing the transition time of the input signals of the respective logic cells. Where the transition time of the input signals is changed, (1) the current drive of the preceding cell is changed, and (2) the capacitive load of an intervening part between the preceding cell and the present cell is changed by (a) changing the resistance load (RLin) at the input side and capacitive load (CLin) at the input side by varying the channel of the intervening part, and (b) adding/inserting or removing a buffer (Buf) between the preceding cell and present cell.

Further, the reliability factor can be varied by changing the transition time of the output signal of the respective logic cells, and the transition time of output signal is changed by (1) changing the current drive of the present cell, and (2) changing the capacitive load of an intervening part between the present cell and subsequent cell by varying (a) the resistance load (RLout) and capacitive load (CLout) of the intervening part between the present cell and subsequent cell or (b) adding/inserting or removing a buffer (Buf) between the present cell and subsequent cell.

In addition, the maximum reliability factor (RFup) and minimum reliability factor (RFmin) are set, depending on the circuit operation time and degradation allowance of a logic product.

BRIEF DESCRIPTION OF THE DRAWINGS

FIG. 7 is a view showing definitions of various types of timings and other information, which are included in delay libraries, in one embodiment according to the invention;

FIG. 8 is a view explaining delay libraries in the form of a table, which store data, in one embodiment according to the invention;

FIG. 12 is a characteristic view showing a propagation delay TpFALL, when the output signal falls, with respect to the output capacitance CL in one embodiment according to the invention;

FIG. 13 is a view explaining delay libraries in the form of a table, to which hot carrier degradation parameters are added, in one embodiment according to the invention;

FIG. 14 is a view explaining the parameters Ac and n with respect to the transition time TinTRAN of input signal of two different cells and output capacitance CL thereof in one embodiment according to the invention;

FIG. 28 is a view showing the addition, insertion and removal of a buffer between the preceding cell and present cell, and between the present cell and subsequent cell in one embodiment according to the invention;

FIG. 29 is a view showing the symbols used in the step of optimizing a product design in one embodiment according to the invention;

DESCRIPTION OF THE PREFERRED EMBODIMENTS

Hereinafter, a description is given of an embodiment of the invention with reference to the accompanying drawings. Also, in all the drawings to describe the embodiment of the invention, parts which are identical to each other are given the same reference numbers, and overlapping description thereof is omitted.

Figure 1:
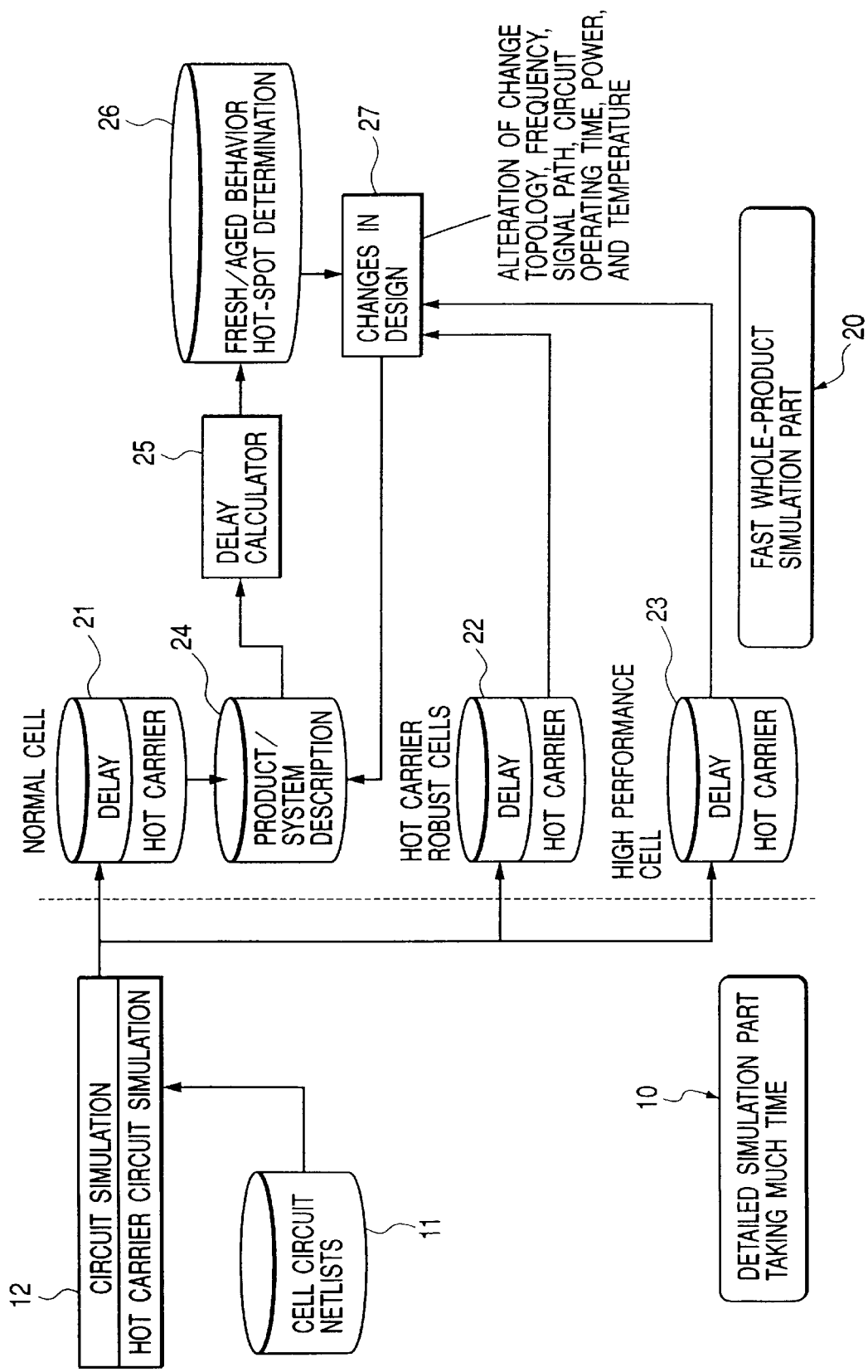
FIG. 1 is functional block diagram showing a design system of a semiconductor integrated circuit device of one embodiment according to the invention.

FIG. 1 is a function block diagram showing a design system of semiconductor integrated circuit devices according to one embodiment of the invention. The design system of the semiconductor integrated circuit devices according to the embodiment is applied to the optimization of reliability and performance when designing a logic product. The corresponding design system includes a time-consuming detailed simulation part 10 (that takes much time) and a fast whole-product simulation part 20, and the design system is constructed so that it does not require any crossing the time-consuming detailed simulation part 10 (that takes much time) and the fast whole-product simulation part 20 when optimizing the design and the overall design optimization can be carried out by the fast whole-product simulation part 20.

The detailed simulation part 10 is provided with a library 11 of cells, circuits, and net lists that store various types of information such as cell data of various types of logic gates, data of logic circuits brought about by combinations of these cells, and data for connections between respective cells and respective logic circuits, and a simulation part 12 that carries out a circuit simulation and hot carrier circuit simulation by using various types of information of the library 11, wherein the results of the simulations are transmitted to the whole-product simulation part 20.

The whole-product simulation part 20 includes three delay libraries 21, 22 and 23 that divide and store information such as delay and hot carriers into normal cells, hot-carrier robust cells, and high-performance cells on the basis of the results of simulations, which are provided from the detailed simulation part 10, and that have parameters for hot carrier degradation calculations; a library 24 that stores information describing a product/system that is constructed by using the information in the normal cells of the delay library 21; a delay calculator 25 for calculating a delay quantity by using the information describing a product/system in the library 24; a library 26 that stores determined information on a place influenced by fresh and aged behavior hot electrons on the basis of the results of calculation made by the delay calculator 25; and a design changing part 27 that optimizes the reliability and performance with respect to changes in topology, frequency, signal path, circuit operating time, power supply, temperature, etc., using the information of hot carrier robust cells and high performance cells of the delay libraries 22 and 23 in relation to the determined place of the library 26 and reflects the optimized information to the library 24 in which information describing the product/system is stored. When optimizing the design, the overall design optimization can be carried out by the whole-product simulation part 20.

Figure 2:
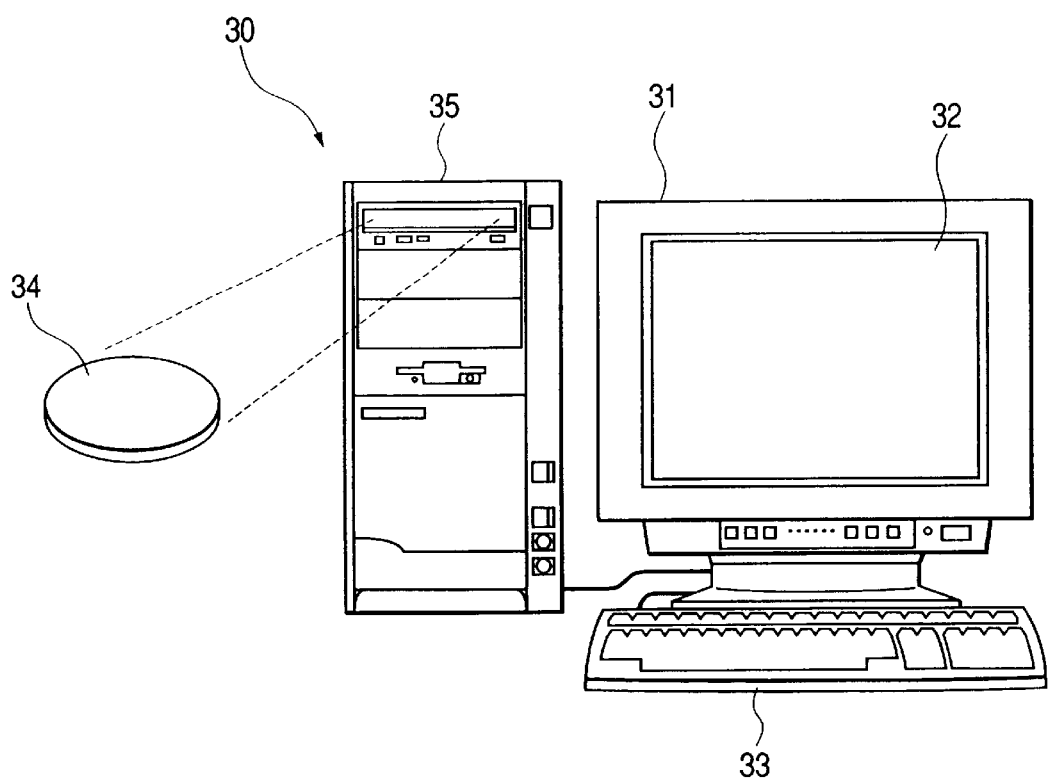
FIG. 2 is a rough configurational view showing an engineering workstation in which a design system of the semiconductor integrated circuit device of a first embodiment according to the invention is constructed.

A design system constructed as described above is constructed on an engineering workstation 30 using computer software such as CAD, DA, etc., as shown in, for example, FIG. 2. Although the detail thereof is not shown, the design system includes a body 31 internally incorporating a central processing unit in charge of control and processing of the entire system and main memory unit for storing control and processing programs, etc., a display unit 32 such as a display formed integrally with the body 31, an input unit 33 such as a keyboard, a mouse, etc., and a sub storage unit 35 to or from which a computer-readable storage medium 34 such as a DVD-ROM, CD-ROM, etc., is attachable or detachable. In the storage medium 34 such as DVD-ROM, CD-ROM, etc., data of the delay libraries 21, 22 and 23 having parameters with respect to the above-described hot carrier degradation calculation are stored. The data are read by an engineering workstation 30 and can be used for designing semiconductor integrated circuit devices.

Next, a description is given of the actions of the embodiment.

Figure 3A:
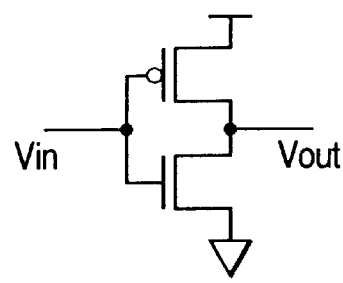
FIG. 3(a) is a circuit view showing an inverter of one embodiment according to the invention.
Figure 3B:
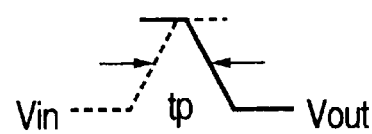
FIG. 3(b) is a signal waveform view showing an input voltage and output voltage therein.
Figure 3C:
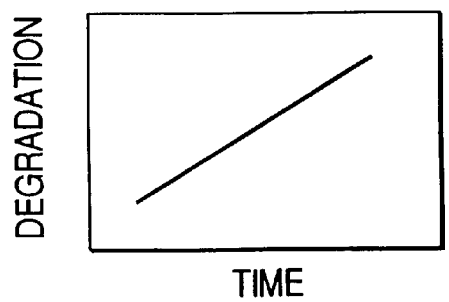
FIG. 3(c) is a characteristic view showing degradation with respect to time.

The description covers:
1. The introduction of hot carrier degradation calculations into the delay libraries, 1-1. Device degradation due to hot carriers, and its actions exerted on propagation delay, 1-2. The design of logic products by cell libraries, 1-3. The creation of delay libraries, 1-4. Additional parameters for hot carrier degradation calculations.
2. The optimization of reliability in the designing of logic products, 2-1. Definition of reliability factors RF, 2-2. The setting of the reliability factors RF in a certain margin, 2-3. The factors to be changed for alteration of the reliability factors RF, 2-4. The alteration of input signal rise time tr and output signal fall time tf due to modification of the design, and changes of the reliability factors FR incident thereto,
3. The setting of the reliability factors FR, 3-1. The alteration of cell reliability, 3-2. The flow of the design, and
4. The addition of hot carrier delay libraries, 4-1. The case where a temperature fluctuation is added, 4-2. The case where a power supply fluctuation is added, 4-3. The circuit operating time and actions due to degradation level changes 1. Introduction of hot carrier degradation calculations into the delay libraries 1-1 Device degradation due to hot carriers, and their action exerting on propagation delay FIG. 3(*a*) through FIG. 3(*c*) describe the time dependence of propagation delay in an inverter with respect to the device degradation due to hot carriers and its actions exerting on the propagation delay where the inverter is taken as an example. FIG. 3(*a*) is a circuit diagram showing the inverter, FIG. 3(*b*) is a signal waveform diagram showing the input voltage and output voltage, and FIG. 3(*c*) is a characteristic view showing the degradation with respect to time. As shown in FIG. 3(*a*), in the inverter, a P-type MOSFET and an N-type MOSFET are connected between the power supply potential and the ground potential, an input voltage Vin is supplied to a gate to which these MOSFETs are commonly connected, and an output voltage Vout is picked up from a connection node. As shown in FIG. 3(*b*), where the input voltage Vin risen from the ground potential to the power supply potential is supplied, the output voltage Vout is made into a waveform that has fallen from the power supply potential to the ground potential.

In such an inverter, as shown in FIG. 3(*c*), the degradation of a driver NMOSFET causes the propagation delay tp to increase with respect to the operating time. Therefore, there is a possibility that the product rate is lowered. The time dependence Δtp (a delay quantity due to an aged degradation) of the propagation delay/tp0 (a delay quantity not degraded at the fresh stage) is expressed by the following factorial equation in the following form:

$$\text{Degradation} = \Delta tp/tp0 = Ac \times t^n \quad \text{Equation (1)}$$

wherein n is a slope of the time dependence, which depends on a transient bias voltage that the circuit configuration and cell receive, and Ac also depends on the transient bias voltage that the circuit configuration and cells receive.

1-2 Design of Logic Products by Cell Libraries

Figure 4:
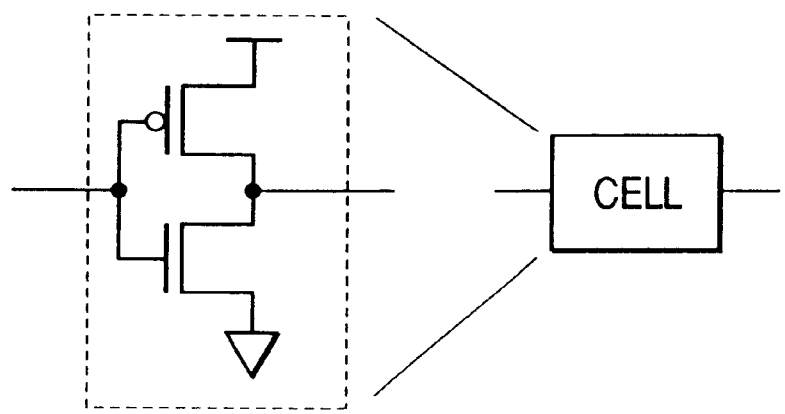
FIG. 4 is an explanatory view showing an inverter cell in one embodiment according to the invention.
Figure 5:
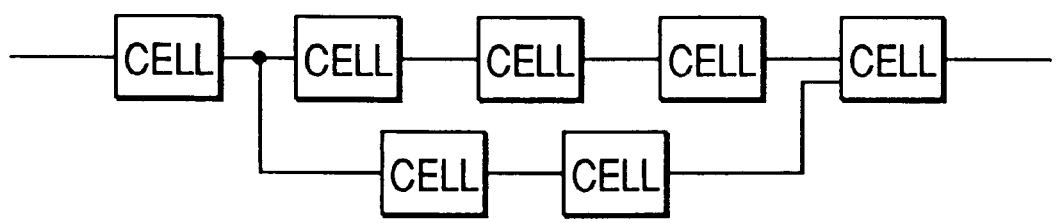
FIG. 5 is a view explaining one system, that is, a product formed so that various types of cells are combined, in one embodiment according to the invention.

FIG. 4 and FIG. 5 describe the design of a logic product by cell libraries. FIG. 4 is a view explaining an inverter cell, and FIG. 5 is a view explaining one system/product formed by combining various types of cells. An inverter cell of FIG. 4 is shown as an example, one logic cell provides a certain basic function by using various transistors that are connected to each other under a certain composition.

Further, as in the system/product of FIG. 5, the design of one system/logic product is carried out by coupling various types of logic cells to each other. A logic product may include several hundred thousand to several millions of cells. Therefore, the number of transistors counts several tens of millions. Accordingly, the circuit simulation is disabled. In order to check the timing, the propagation delays of respective cells are stored in delay libraries, and where a delay is found with respect to the critical path of the corresponding product, the values are added as described later.

1-3 Creation of Delay Libraries

Figure 6:
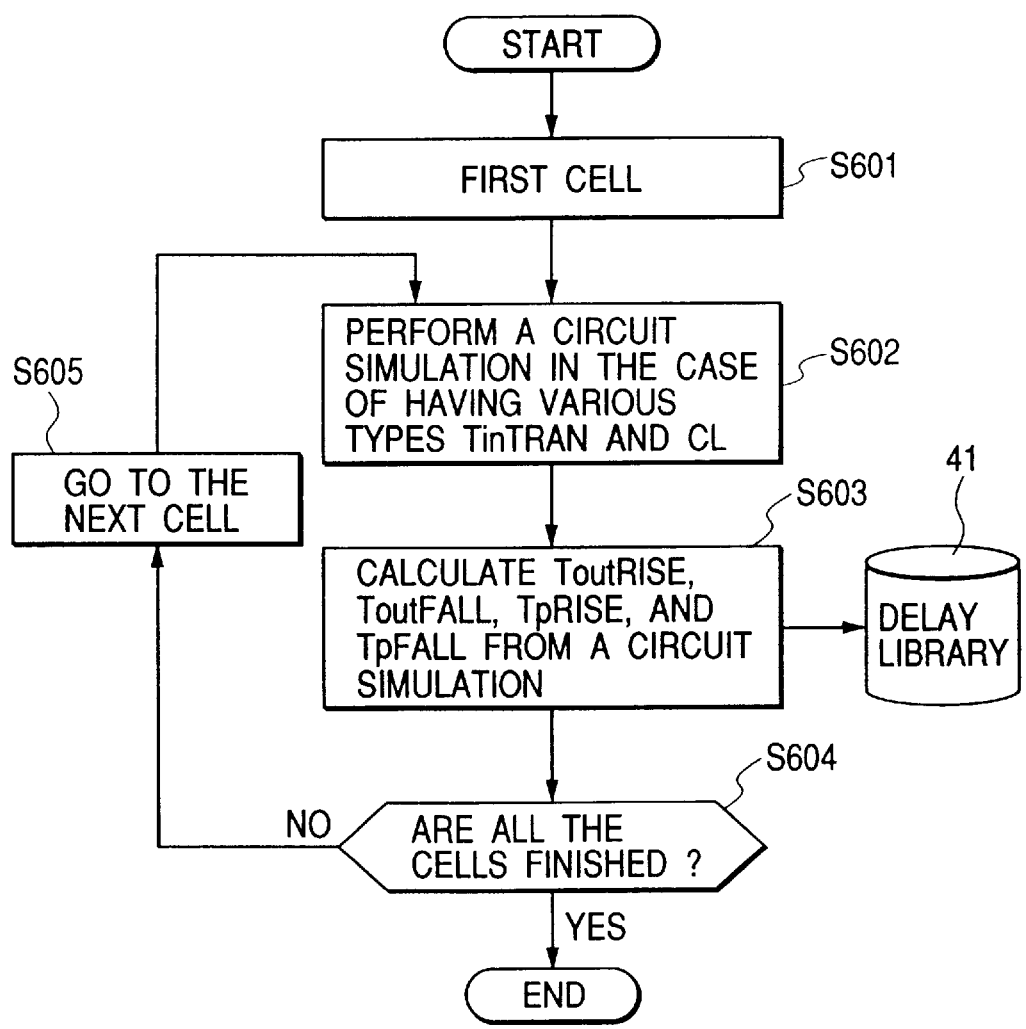
FIG. 6 is a flow chart showing the basic flow when creating delay libraries in one embodiment according to the invention.
Figure 9:
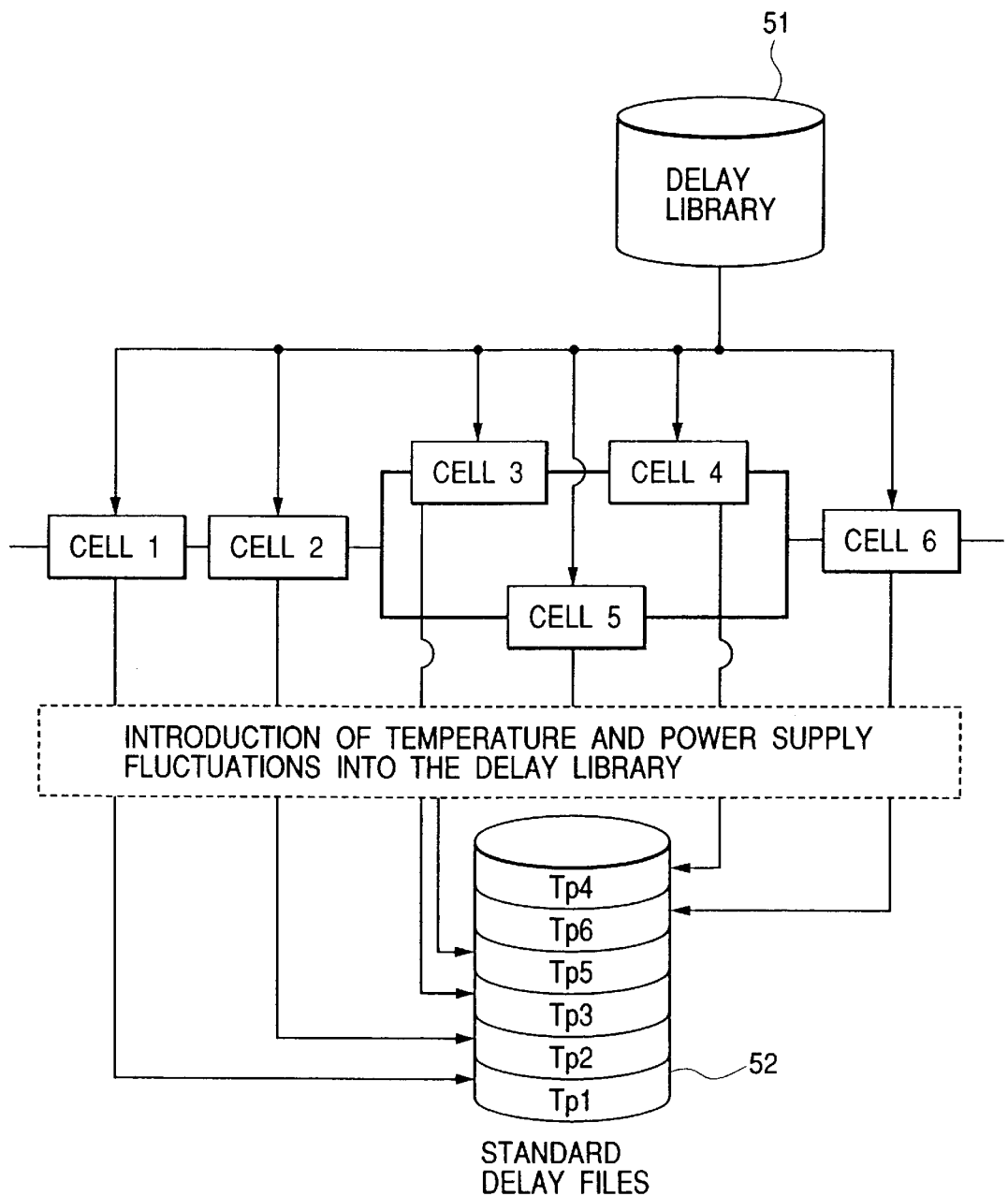
FIG. 9 is a view showing the creation of a standard delay file in one embodiment according to the invention.
Figures 10, 11:
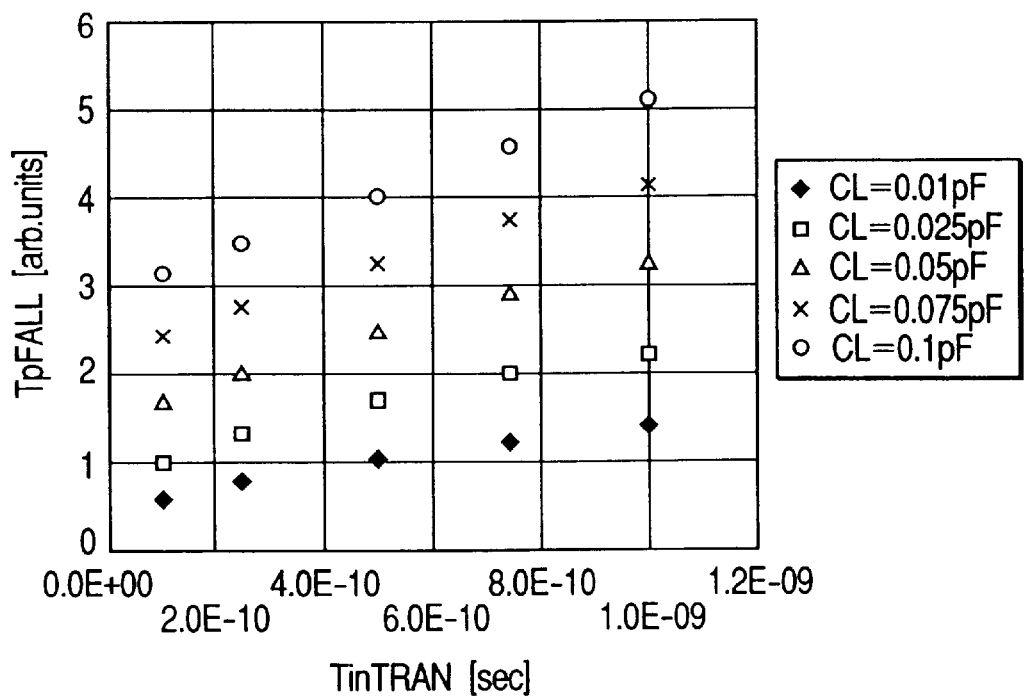
FIG. 10 is a view showing a transition time TinTRAN of input signal of a simple inverter cell and a propagation delay TpFALL dependent on an output capacitance CL when an output signal falls, in one embodiment according to the invention.
FIG. 11 is a characteristic view showing a propagation delay TpFALL, when an output signal falls, with respect to the transition time TinTRAN of input signal in one embodiment according to the invention.

FIG. 6 through FIG. 12 are views explaining the creation of delay libraries, wherein FIG. 6 is a flow chart showing a basic flow when creating delay libraries, FIG. 7 is a view showing the definitions of various types of timings and other information, which are included in the delay libraries, FIG. 8 is a view explaining the delay libraries in the form of a table, in which data are stored, FIG. 9 is a view explaining the creation of the standard delay file, FIG. 10 is a view explaining an input signal transition time TinTRAN of a simple inverter cell and a propagation delay TpFALL the output signal dependent on an output capacitance CL falls, FIG. 11 is a characteristic view showing a propagation delay TpFALL when the output signal corresponding to the input signal transition time TinTRAN falls, and FIG. 12 is a characteristic view showing the propagation delay TpFALL when the output signal corresponding to the output capacitance CL falls.

As shown in FIG. 6, in the first step when creating the delay libraries, the output signal rise transition time ToutRISE, output signal fall transition time ToutFALL, output signal rise propagation delay TpRISE, and output signal fall propagation delay TpFALL are calculated (S603), by using a circuit simulation, with respect to a case (S602) of having various types of input signal transition times TinTRAN and output capacitance CL for the first cell (S601). These values are defined as shown in FIG. 7. The values are stored in the form of a table as shown in FIG. 8. The table itself indicates the delay libraries 41. The above-described process is carried out with respect to the next cells one after another. The process is terminated after all the cells are processed (S604 and S605).

As shown in FIG. 8, the delay libraries use the input signal transition time TinTRAN and output capacitance CL as the input parameters and use the output signal rise transition time ToutRISE, output signal fall transition time ToutFALL, output signal rise propagation delay TpRISE and output signal fall propagation delay TpFALL as the output parameters. The input parameters are used for preparation of a circuit netlist for simulation, and the output parameters are figures calculated by the circuit simulation. For example, as in the delay libraries in which data of various types of inverter cells are stored, delay libraries are formed in the form of a table with respect to various types of logic cells such as AND gate cells and OR gate cells.

In the second step, the synthesized delay library of FIG. 8 is coupled to the design of a product in FIG. 5. As regards respective cells in the product, the input signal transition time TinTRAN and output capacitance CL are obtained after the mutual connection and parasitic elements (C, R, etc., due to the mutual connection) are subtracted. For the respective cells, adequate values of the input signal transition time TinTRAN and output capacitance CL are examined in connection with the delay library, and based thereon, the output signal rise transition time ToutRISE, output signal fall transition time ToutFALL, output signal rise propagation delay TpRISE and output signal fall propagation delay TpFALL are internally inserted.

Next, as shown in FIG. 9, based on the delay library 51 that stores data of various inverter cells and other logic cells, values of all the cells are combined and are made into the standard delay file 52. Thus, it will become possible to calculate a delay of the critical path by a simple addition. That is, as shown in FIG. 9, in a product that is provided with a signal path reaching the output through cell 1, cell 2, cell 3, cell 4 and cell 6 from the input between the input and output, and a signal path reaching the output through cell 1, cell 2, cell 5 and cell 6 from the input between the input and output, the propagation delay Tpn of cell n is calculated by internally inserting the input signal transition time TinTRAN and output capacitance CL of the cells used for the product. The total delay of the critical path can be obtained by the total of the calculated delay quantities of the respective cells. Therefore, the delay total TOT in the standard delay file 52 of the above-described product becomes: TOT=max (Tp1+Tp2+Tp3+Tp4+Tp6, Tp1+Tp2+Tp5+Tp6), wherein Tpn(n=1 through 6) indicates the propagation delay time of cell n.

FIG. 10 shows slight data from the delay library of a certain simple inverter cell. In this table (the same in the subsequent cases), $a.bc \times 10^{-de}$ is expressed to be $a.bcE^{-de}$, which indicates the propagation delay TpFALL of 0.590997, 0.803509, ... and 5.07743 that are obtained by simulations with respect to the input signal transition time TinTRAN (sec) of 1.00E–10, 2.50E–10, ... 1.00E–09 and the output capacitance CL(F) of 1.00E–14, 2.50E–14, ... 1.00E–13. Based on the table, as in FIG. 11, the input signal transition time TinTRAN is taken as the abscissa while the output signal fall propagation delay TpFALL is taken as the ordinate, wherein the output capacitance CL is plotted. Also, the output capacitance CL is taken as the abscissa while the output signal fall propagation delay TpFALL is taken as the ordinate, wherein the input signal transition time TinTRAN is plotted. Thus, FIG. 12 is prepared.

1-4. Additional Parameters for Hot Carrier Degradation Calculations

Figure 15:
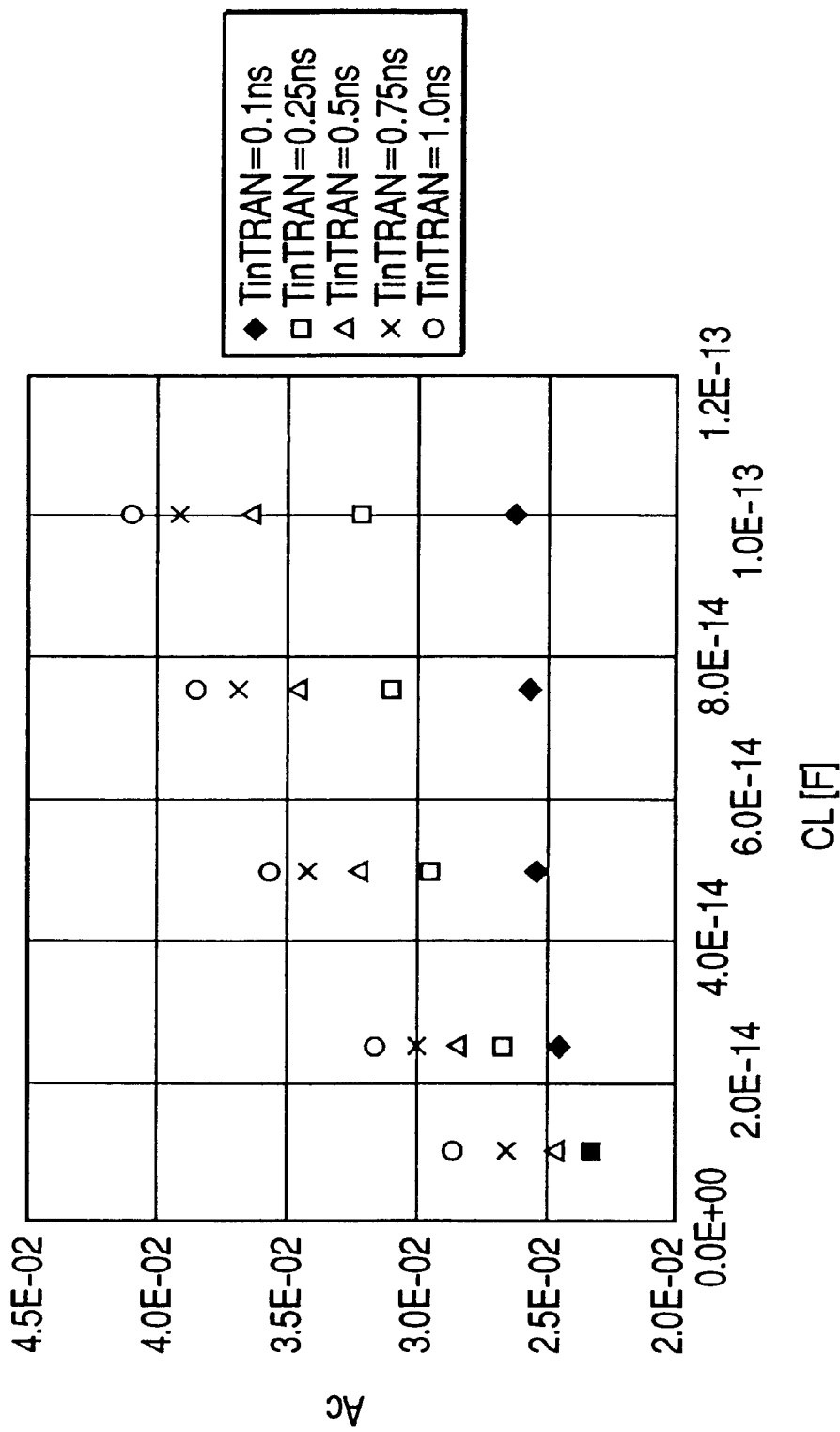
FIG. 15 is a characteristic view showing the transition time TinTRAN of input signal with respect to the output capacitance CL and parameter Ac in one embodiment according to the invention.
Figures 16, 17:
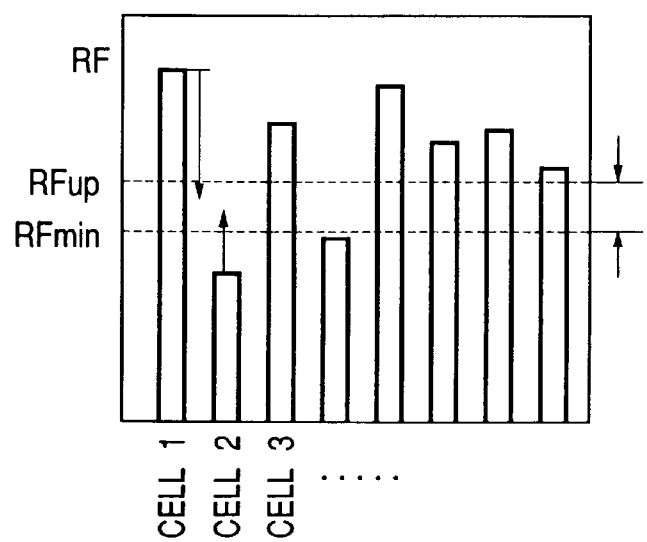
FIG. 16 is a view explaining delay libraries in the form of a table, to which a hot carrier degradation parameter using the modification method is added, in one embodiment according to the invention.
FIG. 17 is a view explaining the reliability factor RF of various types of cells in a product in one embodiment according to the invention.

FIG. 13 through FIG. 16 are views showing a case where a delay library is applied to a hot carrier degradation calculation. FIG. 13 is a view explaining a delay library in the form of a table, to which hot carrier degradation parameters are added, FIG. 14 is a view showing parameters Ac and n with respect to the input signal transition time TinTRAN and output capacitance CL of two differing cells, FIG. 15 is a characteristic view showing the input signal transition time TinTRAN with respect to the output capacitance CL and parameter Ac, and FIG. 16 is a view showing a delay library in the form of a table, to which hot carrier degradation parameters using a modification method are added.

For a hot carrier degradation calculation, in order to introduce the additional parameters into the delay library, as shown in FIG. 13, two new parameters, that is, Ac and n in the above-described equation 1, are added to the Table with respect to the standard delay library format as shown in FIG. 8. Therefore, the delay library into which the additional parameters are introduced uses the input signal transition time TinTRAN and output capacitance CL as input parameters, and adds parameters Ac and n, as output parameters, in addition to the output signal rise transition time ToutRISE, output signal fall transition time ToutFALL, output signal rise propagation delay TpRISE and output signal fall propagation delay TpFALL.

FIG. 14 shows one example of values of the parameters Ac and n. These values are plotted to become FIG. 15. FIG. 14 is a damage table showing the parameters Ac and n pertaining to the input signal transition time TinTRAN and output capacitance CL of two differing cells 1 and 2, which shows parameters Ac of 2.3371E–02, 2.4606E–02, . . . 4.0975E–02 of the cell 1 and 5.4533E–02, 5.7413E–02, . . . 9.5608E–02 of the cell 2, and a parameter n of 0.4, which are obtained by simulations with respect to the input signal transition time TinTRAM (sec) of 1.00E–10, 2.50E–10, . . . 1.00E–09, and output capacitance (CL)(F) of 1.00E–14, 2.50E–14, . . . 1.00E–13. FIG. 15 can be prepared by taking the output capacitance CL as the abscissa and parameters Ac as the ordinate and plotting the input signal transition time TinTRAN.

Further, one modified example can be considered in connection therewith. Since the calculation based on the standard delay library may include several millions of cells, the calculation of degradation using the above-described equation 1 takes such long time that is unfeasible because it is a factorial function. As one of the modification methods, if a logarithm of the above-described equation 1 is employed, the delay calculation thereby includes only addition and multiplication.

First, equation 2 shows a modified version of the above-described equation 1 in a case where the signal frequency is taken into account to calculate the whole degradation of the corresponding cell. That is, where duty Dt and frequency f are taken into account, $$\text{Degradation}=D=Ac\times(Dt\times f/f0\times t)^n=Bc(Dt\times f\times t)^n \qquad \text{Equation 2}$$

where $Bc=Ac/f0^n$ is a frequency when $f0=Ac$ and n are extracted.

If a logarithm of both the sides of the equation 2 is taken, equation 3 can be obtained:

$$\log(D)=\log(Bc)+n\log(Dtft) \qquad \text{Equation 3}$$

or $$\log(D)=\beta+n\log(Dtft) \qquad \text{Equation 4}$$

or $$\text{Log}D=\log(D)=\beta+n\text{Log}F+n\text{Log}t+n\text{Log}Dt \qquad \text{Equation 5}$$

or $$\text{Log}Dt=\log(Dt)$$

where $\text{Log}F=\log(f)$ and $\text{Log}t=\log(t)$ are established. LogF and Logt can be calculated by making reference to a table of logarithms. Next, Using the equation 5, LogD is calculated by carrying out only addition and multiplication. Log(D) can be re-converted to D, using a table of logarithms for simplicity.

FIG. 16 shows the delay library format in this case. As in FIG. 16, with respect to an optional circuit operating time and frequency, which are specified by f and t of the equation 4, it is possible to internally insert hot carrier degradation, using the modification table, in which β is made into an output parameter instead of the parameter Ac, by using the same method of consideration in which calculations of the output signal rise propagation delay TpRISE, output signal fall propagation delay TpFALL, output signal rise transition time ToutRISE and output signal fall transition time Tout-FALL of the delay libraries of FIG. 13 are used.

2. Optimization of Reliability in the Designing of Logic Products

In optimizing the reliability of the designing of logic products, how to optimally balance between the reliability and chip design becomes important.

2-1. Definition of Reliability Factors RF

Defining the reliability factory RF, the RF called quantity is a scale to express how cells are degraded or how the cells affect the output performance of products. The RF is calculated by the following equation 6.

$$RF=1/(\text{Sensitivity}\times\text{Degradation}) \qquad \text{Equation 6}$$

In this case, as shown in FIG. 3, the degradation is a speed degradation $\Delta tp/tp0$. The sensitivity is the quotient obtained by dividing a change in the cell performance by a change in the product performance due to a change in the performance of the specified cell. For example, $$\text{Sensitivity}=(\Delta tp/tp0 \text{ of the critical path})/(\Delta tp/tp0 \text{ of the cell}) \qquad \text{Equation 7}$$

As has been understood from the above description, the reliability factor RF takes into account not only a practical degradation in the cell level but also an actual action that the degradation exerts a product, which is the final determination factor.

2-2. Setting the Reliability Factors RF in a Certain Margin

Figure 18:
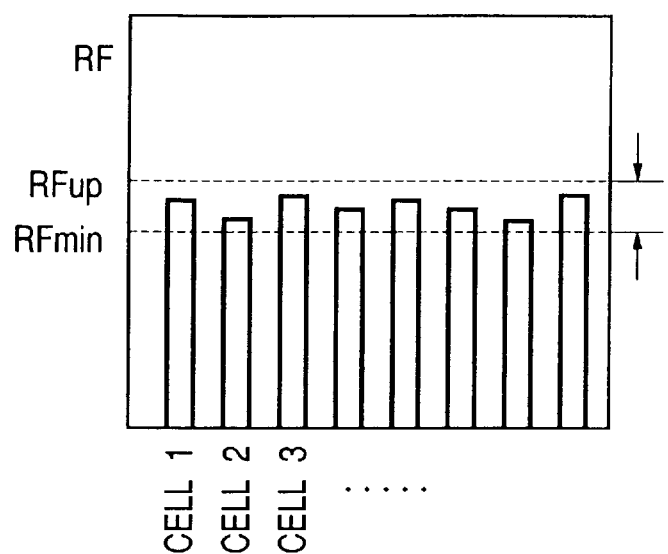
FIG. 18 is a view explaining a case where the reliability factor RF in all the cells are caused to lie in the margin, in one embodiment according to the invention.

FIG. 17 and FIG. 18 are views explaining a case where the reliability factor RF is set in a certain margin. FIG. 17 shows a reliability factor RF of various types of cells in a product, and FIG. 18 is a view explaining a case where the reliability factors RF of all the cells are placed in the margin.

Taking the reliability factor RF into account, in the invention, the RF in respective cells is set so that it can be placed in a specified margin called the maximum reliability factor RFup and minimum reliability factor RFmin (depending on the design). This means not only that the RF of a cell which does not meet the reliability requirement of RFmin is increased (this needs re-designing to increase the reliability), but also that, in the case of RF>RFup, the reliability requirement is reduced with respect to the cells having reliability which is more sufficient than necessary. Reduction of the reliability requirement is achieved by re-designing so that other functions of the cell are further improved. In the invention, the major effect is to reduce the chip size.

As shown in FIG. 17, generally, the reliability factors RF of various type of cells in a certain product are uneven, some of which does not reach the minimum reliability factor RFmin, and some of which exceed the maximum reliability factor RFup. Therefore, a novel concept of the invention is to increase the RF of cells having values lower than the RFmin and to reduce the RF of cells having values larger than the RFup, whereby, as shown in FIG. 18, the RF of all the cells is devised to be placed in a margin from the RFup and the RFmin.

In addition, such a concept is approximate to, for example, the technology of Japanese Patent Laid-Open No. 263540/1996 that the present inventor previously proposed. In the technology, the reliability factor RF refers to that of devices at the level of transistors. Since the whole final performance coefficient to secure a necessary RF has been obtained from circuit simulations, it can be said that it is a technology different from the present invention.

2-3. Factors to be Changed for Alteration of the Reliability Factors RF

Figure 19:
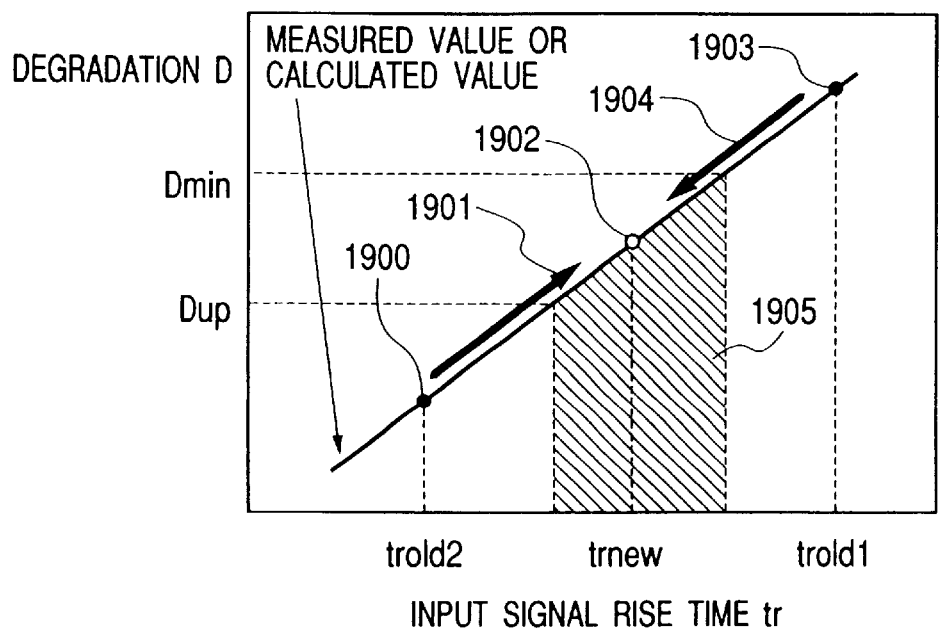
FIG. 19 is a view explaining a case where degradation D is caused to lie in the margin with respect to an input signal rise time tr, in one embodiment according to the invention.
Figure 20:
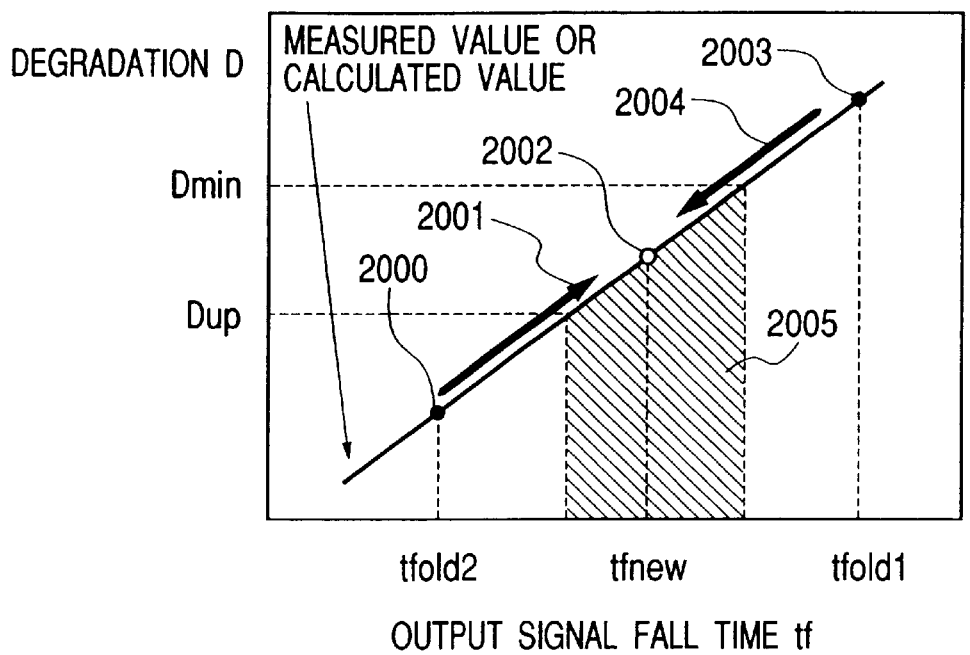
FIG. 20 is a view explaining a case where degradation D is caused to lie in the margin with respect to an output signal fall time tf, in one embodiment according to the invention.

FIG. 19 and FIG. 20 are views explaining factors to change the reliability factor RF. FIG. 19 is a view explaining a case where degradation D is placed within a margin with respect to the input signal rise time tr, and FIG. 20 is a view explaining a case where the degradation D is placed within a margin with respect to the output signal fall time tf.

Where factors to be changed to alter the reliability factor RF are taken into account, cell degradation is changed where it is assumed that the sensitivity is determined, and there are an input signal rise time and an output signal fall time as the two major factors to be adjusted to alter the RF. FIG. 19 and FIG. 20 show the actions exerting on the cell degradation D of the input signal rise time tr and output signal fall time tf.

First, as in FIG. 19, an increase in the input signal rise time tr accordingly increase the degradation D. This applies to the cells for which a CMOS inverter becomes a general component element. The reason is such that the overlapping quantity of the input voltage waveform and the output voltage waveform of the inverter increases, and it extends the time during which the NMOSFET transistor is degraded.

In FIG. 19, if the input signal rise time tr of the cell is excessively long like trold1, the degradation D becomes larger than the maximum degradation Dmin (obtained from the minimum reliability RFmin). If the input signal rise time tr is excessively short like trold2, the degradation D becomes smaller than the minimum degradation Dup (obtained from the maximum reliability RFup), which is requested as a margin. In either case, the degradation is reduced (1903→1902:1904) or increased (1900→1902:1901) by changing the tr, whereby it is possible to place the degradation D within a specified margin (Dup>D>Dmin: 1905).

Next, as in FIG. 20, the cell degradation D depends on the output signal fall time tf. Herein, the degradation D increases along with an increase in tf for the same reason as that in the case of the input signal rise time tr. In this case, if the cell degradation D is too long (for example, at tfold1), tf is reduced (2003→2002:2004) so that the degradation D lies in the margin (Dup>D>Dmin:1805). If the degradation D is lower than the minimum margin Dup in tfold 2, it is possible that the tf is increased (2000→2002:2001) and is placed within the margin.

Figure 21:
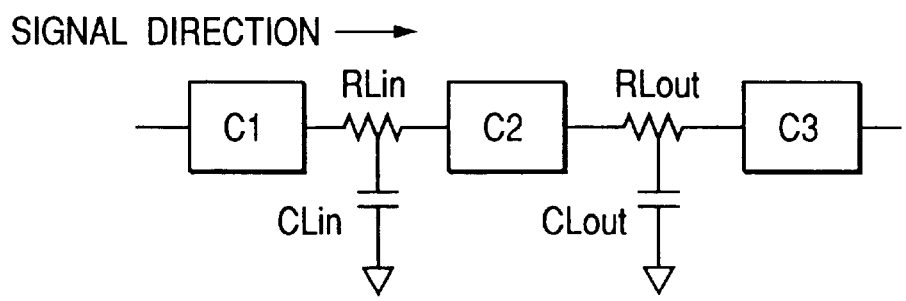
FIG. 21 is a configurational view showing mutual connections between a capacitive load CL inserted between cells and a resistance load RL in one embodiment according to the invention.
Figure 22:
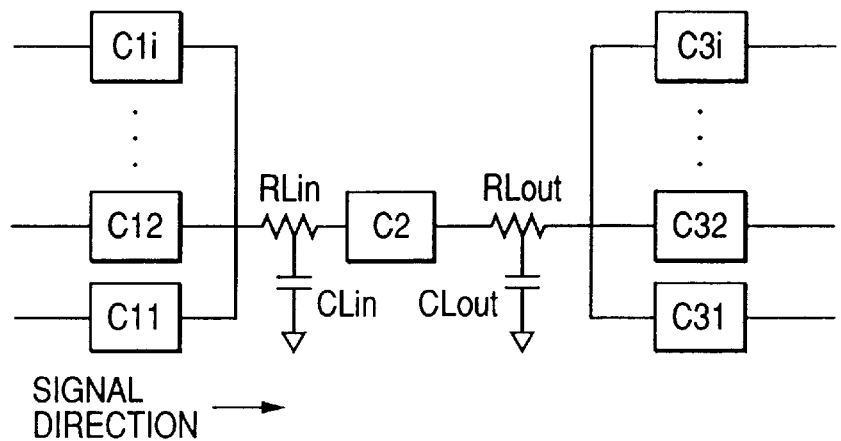
FIG. 22 is a view showing a configuration of fan-in and fan-out, to which a number of cells are connected, in one embodiment according to the invention.
Figure 23:
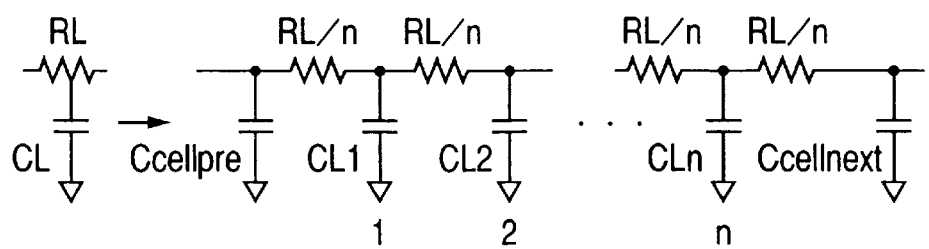
FIG. 23 is a view explaining a shorthand notation method of the resistance load RL and capacitive load CL in one embodiment according to the invention.
Figure 24:
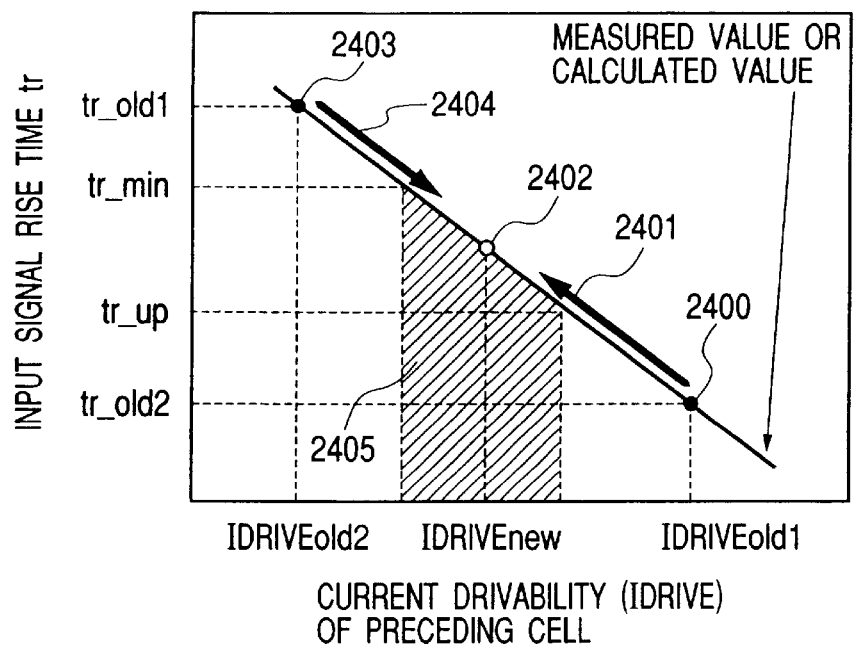
FIG. 24 is a view explaining the actions of an input signal rise time tr with respect of the current drivability IDRIVE in one embodiment according to the invention.
Figure 25:
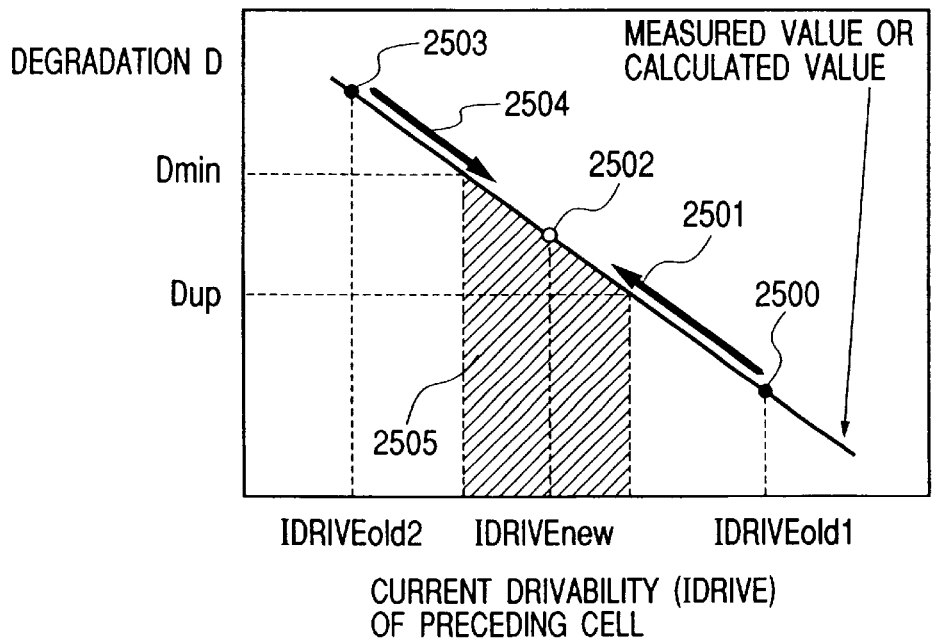
FIG. 25 is a view explaining the degradation D with respect to the current drivability IDRIVE in one embodiment according to the invention.
Figure 26:
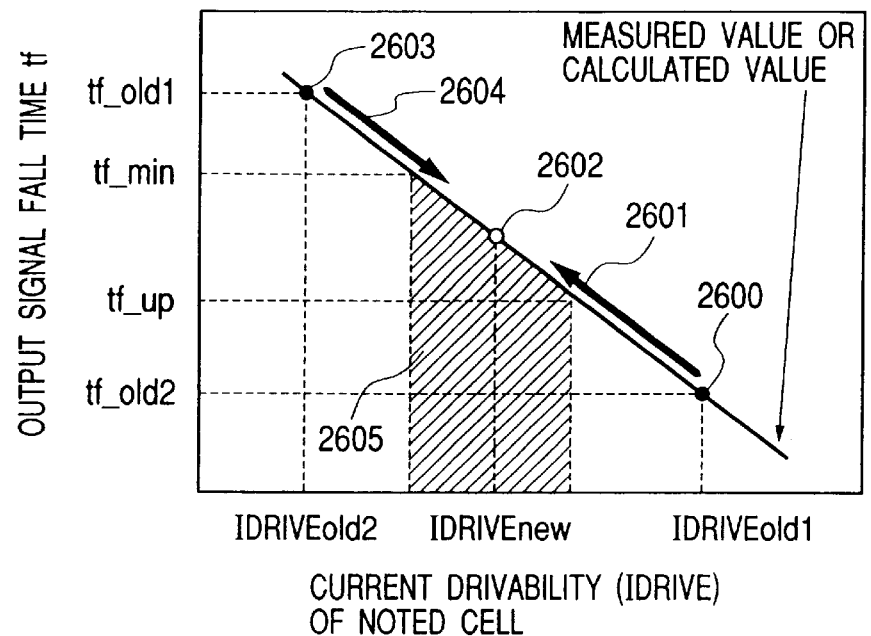
FIG. 26 is a view explaining the actions of an output signal fall time tf with respect to the current drivability IDRIVE in one embodiment according to the invention.
Figure 27:
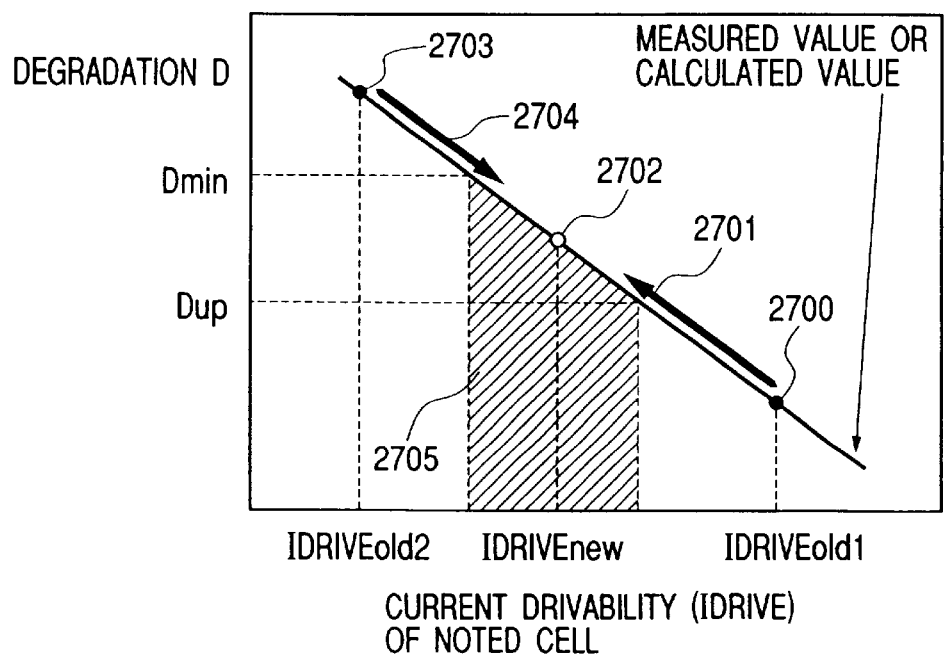
FIG. 27 is a view explaining the degradation D with respect to the current drivability IDRIVE in one embodiment according to the invention.

2-4. Alteration of Input Signal Rise Time tr and Output Signal Fall Time tf Due to Modification of the Design, and Changes of Reliability Factors FR Incident Thereto FIG. 21 through FIG. 27 are views showing a case where the reliability factor RF is altered by changing the input signal rise time tr and output signal fall time tf by modifying the design. FIG. 21 is a configurational view showing mutual connections between a capacitive load CL inserted between cells and a resistance load RL, FIG. 22 is a configurational view showing a fan-in/fan-out construction to which a number of cells are connected, FIG. 23 is a view explaining a shorthand notation of the resistance load RL and capacitive load CL, FIG. 24 is a view explaining the actions of the input signal rise time tr with respect to current drivability IDRIVE, FIG. 25 is a view explaining the degradation D with respect to the current drivability IDRIVE, FIG. 26 is a view explaining the actions of the output signal fall time tf with respect to current drivability IDRIVE, and FIG. 27 is a view explaining the degradation D with respect to current drivability IDRIVE.

Herein, a description is given of various ways of changing feasible designs in order to change the reliability factor RF of a specified cell. The main point of emphasis resides in that a certain design (in the case of RF>RFup) of a reliability margin having an ample size is modified so that all the reliability factors RF are placed within a specified margin, whereby it is possible to reduce the chip size simultaneously while maintaining the reliability.

First, as in FIG. 21, a chain of blocks includes three cells C1 through C3. A signal flows from the cell C1 to the cell C3. And, the cells are interconnected to each other by the capacitive load CL and resistance load RL of an intervening substance inserted between the connected cells. Further. FIG. 22 shows a general case where fan-in in which a number of cells C11 through C1i are connected at the input side and fan-out in which a number of cells C31 through C3i are connected at the output side are found. In both cases, the cell of interest (the cell to adjust the RF) is denoted as C2. The resistance load RLin and capacitive load CLin are connected to the input side of the cell C2 of interest, and the resistance load RLout and capacitive load CLout are connected to the output side thereof, respectively.

For example, as in FIG. 23, the resistance load RL and capacitive load CL interposed in the above-described FIG. 21 and FIG. 22 can be expressed in a shorthand notation. Ccellpre is an output side capacitive load of the preceding cell pre-connected to the cell of interest, and Cellnext is an input side capacitive load of the following cell post-connected to the cell of interest.

As in FIG. 24, it is necessary to note that, in the case where the current drivability of the preceding cell preceding the cell of interest (when having changed the drivability of the cell C1 in, for example, FIG. 21), reduction of the current drivability IDRIVE increases the input signal rise time tr, and an increase in the current drivability IDRIVE reduces the input signal rise time tr. That is, if the current drivability IDRIVE of the preceding cell is low (IDRIVEold2), the input signal rise time tr of the cell of interest is reduced from trold1 (2403→2402:2404), and if it is high (IDRIVEold1), the input signal rise time tr thereof is increased from trold2 (2400→2402:2401), whereby the input signal rise time tr may be placed in a range (trup>tr>trmin: 2405).

By using FIG. 24 along with the above-described FIG. 19, it is possible to obtain the dependence of the degradation D on the current drivability IDRIVE dependence. By plotting the relationship between FIG. 24 and FIG. 19, FIG. 25 can be obtained. It is necessary to note that reduction of the current drivability IDRIVE increases the degradation. The technology of lowering the chip area according to the invention depends on this feature. That is, by reducing the degradation D of the cell of interest (2503→2502:2504) or increasing it (2500→2502:2501) by changing the current drivability IDRIVE of the preceding cell, it is possible to place the degradation D within the margin (Dup>D>Dmin: 2505).

In addition, in order to adjust the reliability factor RF, it is possible to develop a method similar to the above case in the case of adjusting the output signal fall time tf. As in FIG. 26, as in the case of the input signal rise time tr, reduction of the current drivability IDRIVE of the cell of interest increases the output signal fall time tf. That is, if the current drivability IDRIVE of the cell of interest is low (IDRIVEold2), the output signal fall time tf is reduced from tfold1 (2603→2602:2604), and if it is high (IDRIVEold1), the output signal fall time tf is increased from tfold 2(2600→2602:2601), whereby the tf will be placed within the margin (tfup>tf>tfmin:2605)

By using FIG. 26 along with the above-described FIG. 20, it is possible to obtain the dependence of the degradation D on the current drivability IDRIVE dependence. By plotting the relationship between FIG. 26 and FIG. 20, FIG. 27 can be obtained. The degradation increases in line with reduction of the current drivability IDRIVE of the cell of interest. That is, the degradation D is reduced (2703→2702:2704) or increased (2700→2702:2701) by changing the current drivability IDRIVE of the cell of interest, whereby the degradation D may be placed within the margin (Dup>D>Dmin:2705).

Also, such a concept is approximate to, for example, the technology of Japanese Patent Laid-Open No. 263540/1996 that the present inventor previously proposed. However, since the technology was based on a device in the level of transistors, the point of the present invention differs from the above-described technology in that the degradation D is measured at the level of cells, and the adjustment is carried out by the input signal rise time tr and output signal fall time tf.

3. Setting of the Reliability Factors FR

A further detailed description is given of a process of optimizing the product design by placing the reliability factor RF of all the cells within a certain level.

3-1. Alteration of Cell Reliability

FIG. 28 is a view explaining a case of changing the reliability factor of cells, which shows addition/insertion or removal of buffers between the preceding cell and the present cell and between the present cell and following cell.

Where the reliability factor of cells is changed, as described above, the method for optimizing the cell design by narrowing the reliability margin is based on the fact that, if there are clearly some cells having a large reliability margin, there is a possibility that some performance factors can be improved while sacrificing other performance factors, by which the reliability of such cells is lowered by modifying the large reliability margin thereof. This method is concurrently used along with the method of increasing the reliability of cells that do not meet the minimum reliability requirements. To make the method clear, the following three points are to be confirmed.

The three points are:

(1) Quantity to judge the reliability (2) Which cell performance factors are to be modified to optimize the product design while sacrificing to place the reliability quantity of (1) within a predetermined margin, and (3) Which cell performance factors are to be modified in order to increase the reliability of cells, which is lower than the minimum reliability requirement defined by the definition of (1).

First, the quantity to judge the reliability (1) is defined as a reliability factor RF in the above-described equation 6. Not only the actual performance degradation of cells but also the influence that the quantity exerts the entire performance of a product or a part (for example, critical path) of the product are taken into account. The action called "sensitivity" is defined in the above-described equation 7.

Next, a cell design to be changed is established in order to change the level of the reliability factor RF with respect to respective cells. There are basically two cases for changing the reliability of the cells, which are an input signal transition time of cells, and an output signal fall time of cells. The actions thereof are shown in the above-described FIG. 19 and FIG. 20. In the above description, the signal is described in terms of the input signal rise time and output signal fall time. Herein, however, these signals are generalized to be an input signal transition time and output signal transition time. Because, there are some cells in which the input signal fall time and output signal rise time may have a specified action, and all the cells do not necessarily invert their signs when shifting from input to output.

Next, a description is given of which design changes are feasible to change the input signal transition time and output signal transition time of the cells. Some of these changes are already described in the above-described FIG. 24 through FIG. 27. However, they may be listed as shown below:

When changing the input signal transition time;

(1) change the current drivability of the preceding cell (the cell immediately before the present cell of interest), (2) change the capacitive load of the intervening part between the preceding cell and the present cell as follows;

(a) change the RLin and CLin of the above-described FIG. 21 by changing the path of the intervening part, or (b) Add/insert or remove the buffers (Buf in and Buf out) between the preceding cell and the present cell (FIG. 28).

When changing the output signal transition time;

(1) change the output transition time by changing the current drivability of the present cell of interest, (2) change the capacitive load of the intervening part between the present cell and the following cell (the cell immediately after the present cell) as follows;

(a) change the RLout and CLout of the above-described FIG. 21 by changing the path of the intervening part; or (b) add/insert or remove the buffers (Buf in and Buf out) between the present cell and the following cell (FIG. 28).

3-2. Flow of the Design

Figure 30:
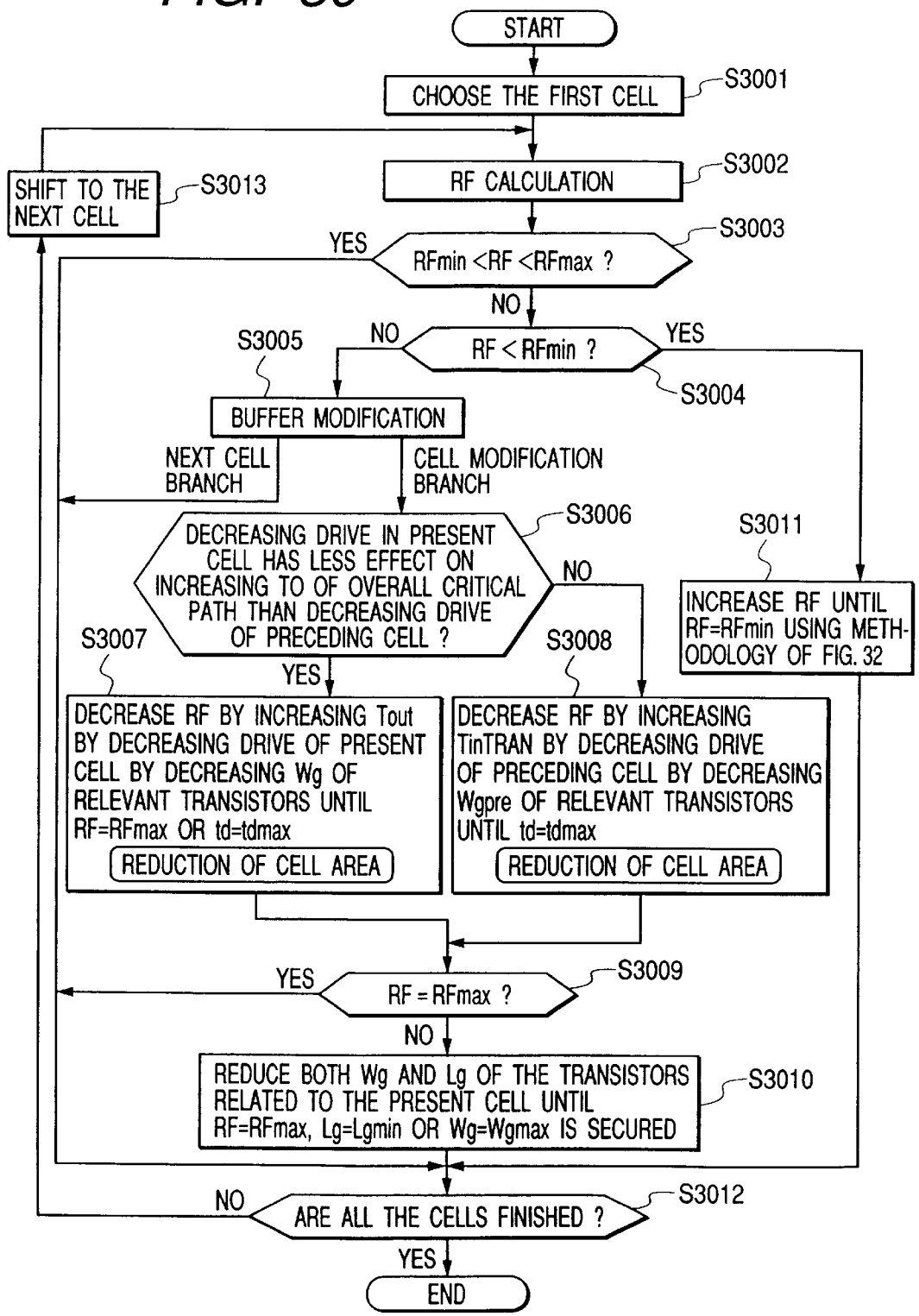
FIG. 30 is a flow chart showing the steps of optimizing a cell library so that the reliability factor RF of the overall cells is caused to lie within a level in one embodiment according to the invention.
Figure 31:
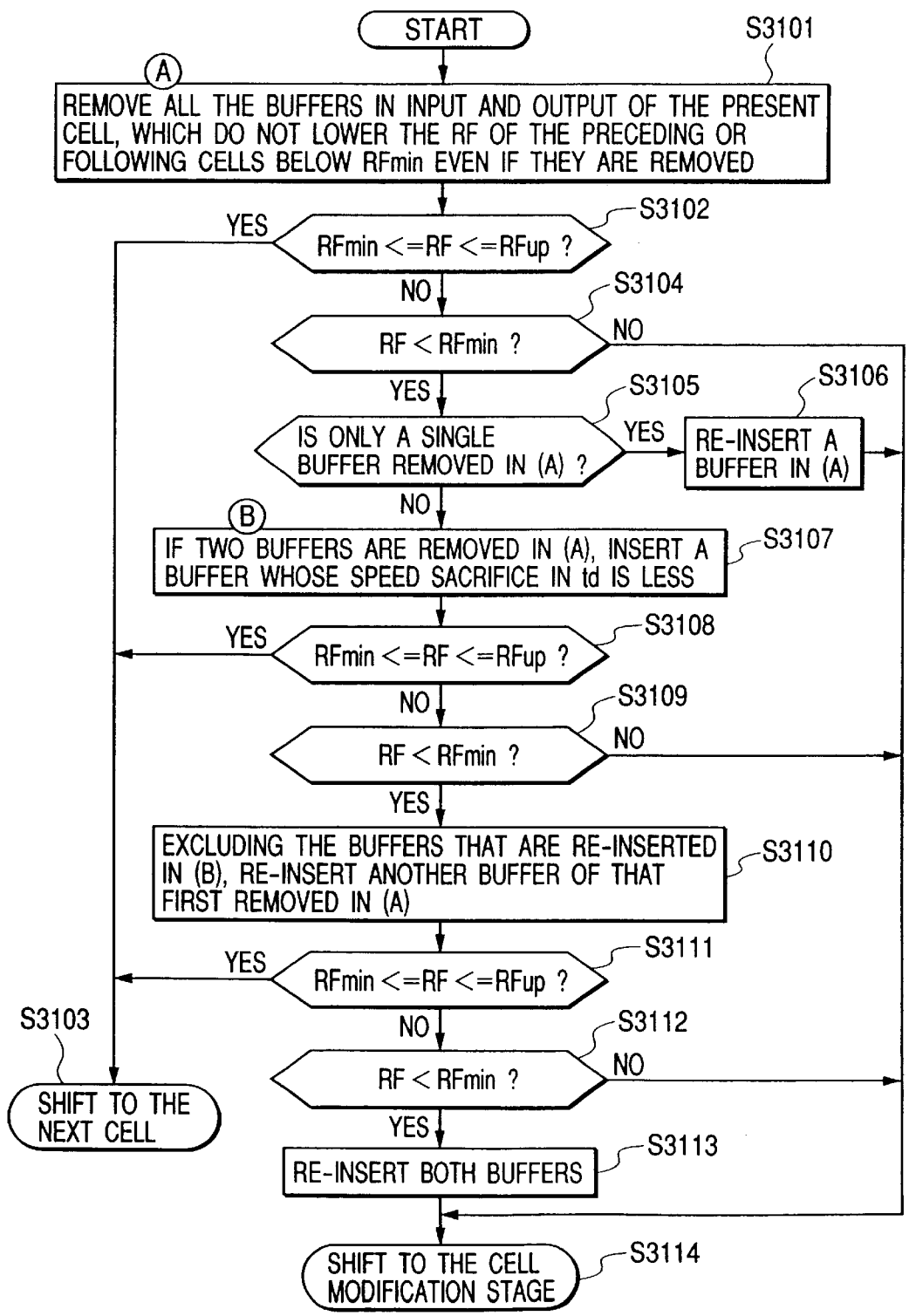
FIG. 31 is a flow chart showing a buffer modifying step in a case where the reliability factor is higher than necessary in one embodiment according to the invention.
Figure 32:
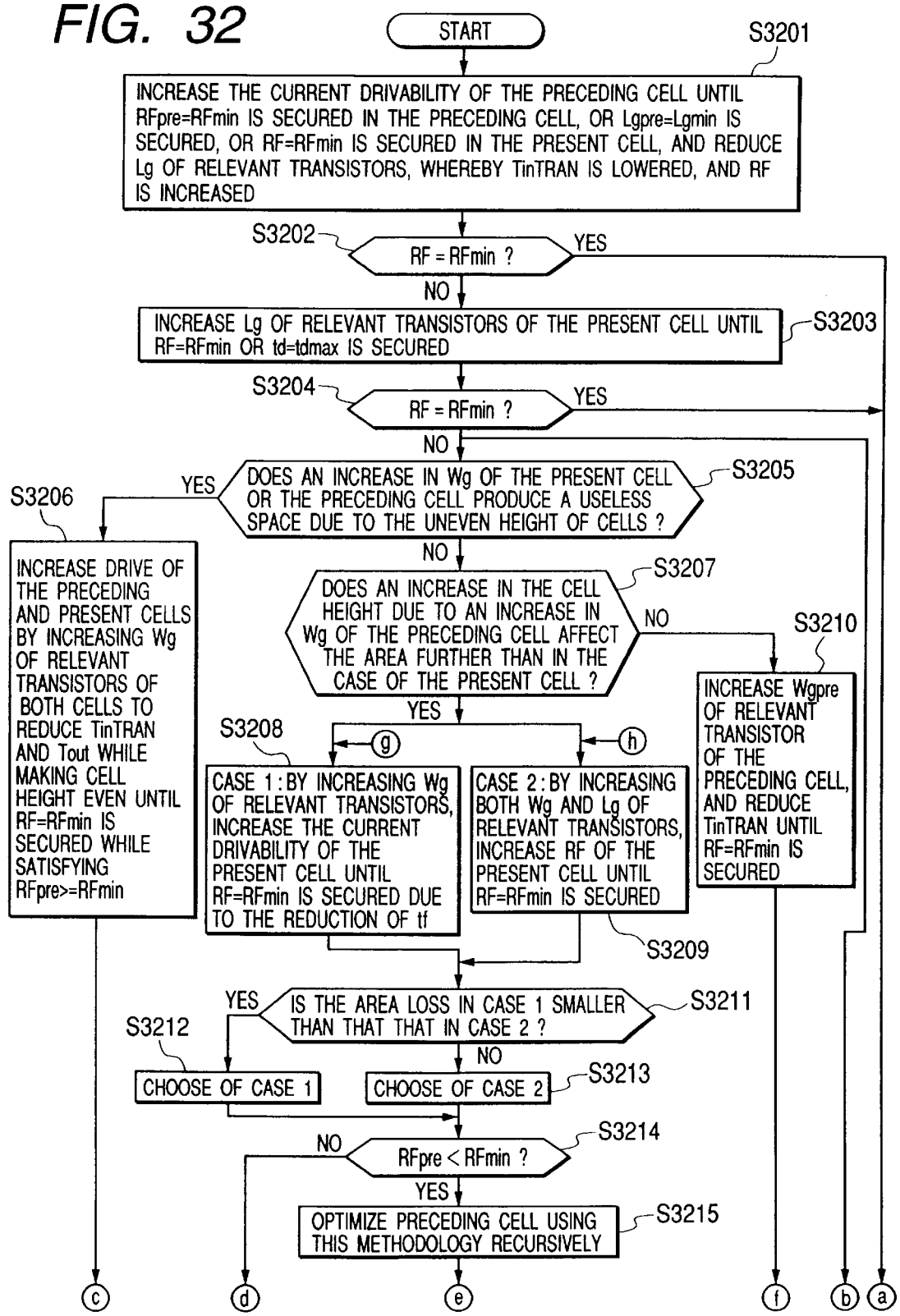
FIG. 32 is a flow chart showing the optimizing step by which the reliability factor is increased while maintaining an increase in the cell area at the minimum level, in one embodiment according to the invention.
Figure 33:
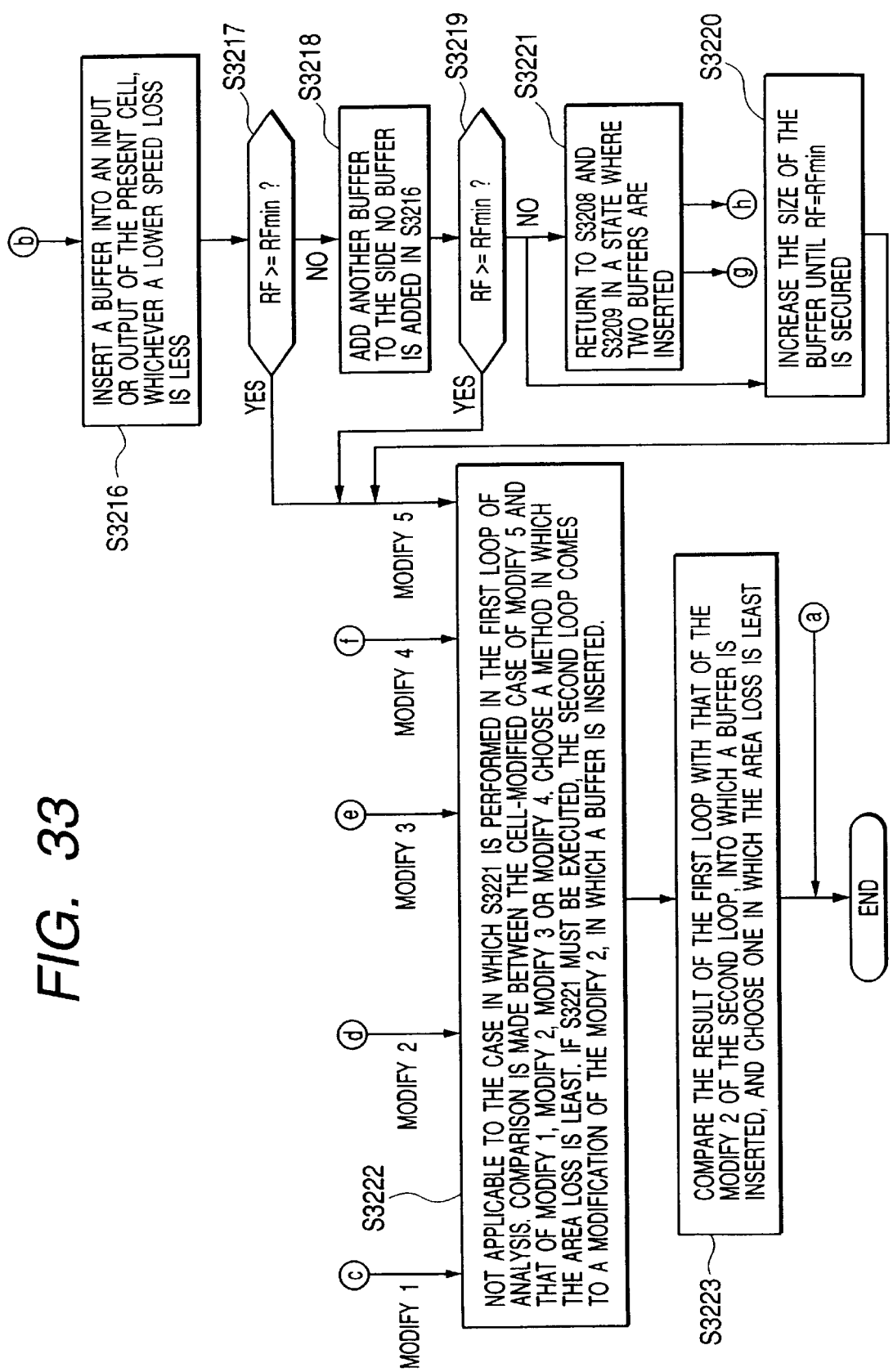
FIG. 33 is a flow chart showing the optimizing step, by which the reliability factor is increased while maintaining an increase in the cell area at the minimum level, subsequent from FIG. 32, in one embodiment according to the invention.

FIG. 29 through FIG. 33 are views explaining the process of optimizing the product design, wherein FIG. 29 is a view explaining legends used in the optimizing process of product design, FIG. 30 is a flow chart showing the optimizing process of cell libraries so that the reliability factor FR of all the cells are placed within a level, FIG. 31 is a flow chart showing a buffer-modifying process where the reliability factor is excessively higher than necessary, and FIG. 32 and FIG. 33 are flow charts showing the optimizing process for increasing the reliability while minimizing an increase in the cell area.

In the above-described concept and idea, a detailed description is given of a design flow aiming for the reliability factors RF of all the cells to be placed within a certain margin, by changing the reliability factors thereof. As shown in the above-described FIG. 17 and FIG. 18, the entire concept resides in that the reliability factor RF of all the cells, which is less than the minimum reliability factor RFmin of the predetermined reliability factor RF, is increased and placed in a range between the minimum reliability factor RFmin and the maximum reliability RFup, including both the limits, and the RF of all the cells, which is more than the predetermined maximum reliability factor RFup, is reduced and placed in a range between the RFmin and RFup, including both the limits. The present invention can be said to be a novel technology with respect to the delay library level in that the RF is reduced so that it is placed in a range between the RFup and RFmin, in addition to the technology of increasing the RF so that it meets the minimum reliability factor RFmin requirements.

In FIG. 30 and FIG. 31, reference to the above-described tr (input signal rise time) and tf (output signal fall time) is converted to more general legends TinTRAN and Tout. Further, a change in the capacitance of the intervening part or removal of any one of previously inserted buffers is added as one of the ways of changing the Tout.

First, referring to FIG. 30, after the method of optimizing a cell library is started, the first cell is chosen (S3001), and the reliability factor RF is calculated (S3002). If the RF is between the minimum reliability RFmin and the maximum reliability RFmax (S3003), the algorithm goes to the next cell. On the other hand, if the RF is not within the range, it is determined whether the RF is less than the range or more than the range (S3004). If the RF exceeds the range, since the cell has a reliability factor higher than necessary, a process of increasing the advantages will be enabled in other areas of the design.

First, a buffer modification is carried out (S3005). The detail of the method is described with reference to FIG. 31 later. Herein, if RFmin<=RF<=RFmax is secured, the algorithm goes to the next cell.

If RF>RFup, the process goes to S3006. Herein, it is determined whether or not the action with respect to the total delay td of the critical path of the cell in question is slighter than that of the preceding cell. If so, reduction of the RF of the present cell by increasing the Tout of the present cell is the most advantageous in lowering of the reliability margin while maintaining the influence to the total delay td at the minimum. The Tout of the present cell can be reduced by narrowing the gate width Wg of some transistors in the cell and accordingly making the cell area small (S3007). Reduction of the RF and increase in the Tout are feasible until the RF becomes equal to the RFmax or reaches the point where the critical delay td=maximum permissible delay tdmax, whichever comes early.

If the reduction of the current drivability of the preceding cell has less influence with respect to the total critical delay td, a process similar thereto is enabled (S3008), except the processing with respect to the preceding cell.

Finally, If RF=RFmax (S3009) in the final stage, the algorithm goes to the next cell. On the other hand, if RF>RFmin due to reaching the delay limit, the gate width Wg of some transistors and of gate length Lg (Since the Lg is reduced, the degradation of a device is increased, resulting in a lowering of the RF) are reduced while maintaining the current drivability (therefore, while keeping the td constant), the RF can be lowered (S3010).

Returning to S3004, if RF<RFmin, in this case, since the cell does not have an ample reliability, modification is carried out with reference to FIG. 32 and FIG. 33, which are described later (S3011). Finally, it is checked whether or not all the cells have been processed (S3012). If not, the analysis operation moves to the next cell (S3013). If all the cells have been processed, the optimizing process of the cell library is terminated.

Next, a description is given of an algorithm used to perform a buffer modification in S3005 of the above-described FIG. 30, using FIG. 31. Referring to FIG. 31, first, surplus buffers in the input or output are all removed (S3101). Surplus buffers means those that do not lower the RF of the preceding and following cells to less than the RFmin even if they are removed. If RFmin<=RF<=RFup (S3102), the algorithm goes to the next cell (S3103). The chip area is reduced by removing the buffers. If the RF is not within a predetermined margin and the RF is larger than the RFup (S3104), the algorithm goes to the stage of cell modification. On the other hand, if the RF still remains larger than the RFup, the algorithm moves to a modification step of cells. On the other hand, if the RF becomes lower than the RFmin, one of the buffers is re-inserted.

Provisionally, if it is assumed that only one buffer is removed in (A) (S3105), the buffer removal means that RFmin<=RF<=RFup is not achieved. Therefore, after a buffer is re-inserted (S3106), the process immediately advances to the stage of cell modification. If two buffers are removed in (A), a buffer in which the speed sacrifice is less in td is inserted (S3107).

Next, it is determined whether or not addition of the single buffer can bring about RFmin<=RF<=RFup (S3108). If it is brought about, the algorithm goes to the next cell (S3103). If not, it is checked again whether or not RF<RFmin (S3109). If not, the process moves to the stage of cell modification.

If RF<RFmin, the buffer is removed, and addition of the buffer that has been first removed in (A) is tried (S3110). Again, whether or not RFmin<=RF<=RFup is checked again (S3111). If it is secured, the process moves to the next cell (S3103). If not, whether or not RF<RFmin is checked again (S3112). If not, the algorithm goes to the stage of cell modification (S3114).

If RF<=RFmin, that means that, even if any one of the buffers is removed, the reliability of the present cell is lowered to less than the minimum reliability factor RFmin. Therefore, both drivers are added again in S3113, and the algorithm goes to the stage of cell modification (S3114).

Next, a description is given of the algorithm of a method of handling a case where the reliability factor of the original cell is RF<RFmin in S31011 of the above-described FIG. 30, with reference to FIG. 32 and 33. A major object of the modification is to increase the reliability while keeping an increase in the cell area at the minimum level. First, TinTRAN is reduced by increasing the current drivability of the preceding cell and reducing the Lg of the relevant transistor of the preceding cell. This process is carried out until the RFpre of the preceding cell becomes RFmin or the Lgpre becomes Lgmin or the RF of the present cell becomes RFmin, whichever comes fast (S3201). This process keeps at least the size of cells constant.

If the present cell becomes RF=RFmin (S3202), the algorithm moves to the next cell. If RF<RFmin, the Lg of the relevant transistor of the present cell is increased (S3203) until RF=RFmin is secured or td=tdmax is secured, until first reaching any one of the limits.

If RF=RFmin is achieved (S3204), the algorithm goes to the next cell. If RF<RFmin, it becomes necessary to increase the cell size or insert a buffer. Herein, the process is branched to the modification step (S3205) of the existing cell or the insertion step (S3216) of buffers. First, a description is given of the modification of the existing cell.

In S3205, an analysis operation is executed. However, at this time, if an increase (to increase Wg) in the cell size in either the present cell or the preceding cell produces a wasted space due to uneven cell height, the Wg of both the preceding cell and present cell is adjusted by reducing TinTRN or Tout in some cases, so that the cell height can be thereby kept fixed while lowering the RF (S3206).

If no wasted space is produced even by increasing the cell height in either the preceding cell or the present cell in S3205, an analysis operation is executed, wherein it is checked whether or not an increase in the cell height of the preceding cell affects the area further than in the present cell (S3207). If a loss in the area due to an increase in the cell height of the present cell is less, the process can be branched to two paths S3208 and S3209 (Based on the fact that the reliability can be greatly increased by a slight increase in the cell height, and the fact that, since an increase in the cell height utilizes a previously wasted space, the resultantly balanced area is made free from any increase or decrease, the loss in area is confirmed).

In case 1 (S3208), the drivability of the present cell is increased until RF=RFmin is secured, by increasing the Wg of the relevant transistor. Although the reliability is increased in case 2 (S3209), the reliability is increased by increasing both Wg and Lg while keeping the current drivability constant. Wg may be increased at the same ratio as that of the Lg so that the ratio of Wg/Lg is kept constant, or may be increased at a ratio slightly lower than the above-described ratio. In the latter case, although the current drivability is lowered, the reliability can be still increased due to an increase in the Lg.

Once the analysis is finished with respect to these two cases, which one of the two cases gives the minimum loss in area is determined in S3211. Either one of S3212 or S3213 is chosen.

At this moment, it is checked (S3214) whether or not the preceding cell meets the reliability limit. The reason of introduction of the check is based on the fact that an increase in Wg of the present cell results in an increase in the capacitive load in input and further results in an increase in TinTRAN, wherein an increase in Tout of the preceding cell is brought about. If the preceding cell meets the reliability limits, the process moves to S3222. If RFpre<RFmin, the process is inverted, and the process is commenced from the above-described FIG. 30 using this method, thereby optimizing the preceding cell (S3215).

In S3207, if the loss in area, which results from the modification of the preceding cell, is less, the process goes to S3210. Herein, Wgpre of the relevant transistor of the preceding cell is increased, and the TinTRAN is reduced until RF=RFmin is secured. At this moment, depending on situations, design change candidates may be displayed as Modify 1, Modify 2, Modify 3 and Modify 4.

Next, a description is given of a method of inserting buffers. First, a buffer is inserted into either one of input or output of the present cell, in which the speed loss is less (S3216). In this case, the speed loss means a minimum increase of td of the critical path, or in some cases, the maximum lowering of delay due to a faster signal transition time. At this moment, if RF>=RFmin (S3217), the process advances to S3222 as Modify 5. If the RF is still less than RFmin, still another buffer is added (S3218) to the side where no buffer is added in S3216. At this moment, if RF>=RFmin (S3219), the process goes to S3222.

On the other hand, if RF<RFmin, either an increase in the buffer drivability or a combination of buffer insertion and modification of the present cell is requested. Therefore, in this case, until RF=RFmin is secured, Wg of the buffer is increased, the current drivability is thereby increased, and TinTRAN and/or Tout are/is thereby reduced (S3220). Next, the process goes to S3222. In order to concurrently use the buffer insertion and the present cell modification, the process returns to S3208 and S3209 in a state where the buffer is inserted (S3221). In this case, it is necessary to note that S3215 is not required. Because, the present cell modification is separated from the preceding cell by the buffer. Therefore, in the second loop, only the Modify 2 will be a target of the subsequent consideration.

Finally, the following is carried out in S3222. Although this is not applicable to the case in which S3221 is performed in the first loop of analysis. Comparison is made between the cell-modified case of Modify 5 and that of Modify 1, Modify 2, Modify 3 or Modify 4. A method in which the area loss is least is chosen. If S3221 must be executed, the second loop comes to a modification of the Modify 2, in which a buffer is inserted. Finally, in S3223, the result in the first loop is compared with the result of the Modify 2 in which the buffer of the second loop is inserted, and a case in which the loss in area is minimized is chosen. Thereafter, the process is terminated. Herein, the process returns to S3012 in FIG. 30.

4. Addition of Hot Carrier Delay Libraries

A description is given of an expanded case in which temperature fluctuations and power supply voltage fluctuations are added as additional parameters to the hot carrier delay libraries, and at the same time, a description is given of an expanded case in which the above-described circuit operating time and alteration of the degradation level of the hot carrier delay libraries are taken in.

4-1. Case Where a Temperature Fluctuation is Added

Where temperature fluctuations are added, the temperature fluctuations can be taken in the above-described equation 1 and parameter Ac of FIG. 8 or equation 5 and parameter β of FIG. 16. The basic equation describing the temperature dependence can be expressed as follows; That is, $$Ac = \{Ac0 \times \exp(-Ea/kT)\}^{-n} \quad \text{Equation 8}$$

Therefore, β can be expressed as follows;

$$\beta = -n \times \{\beta 0 - (Ea/kT) \times \log(e)\} \quad \text{Equation 9}$$

where k is Boltsmann constant, and Ea is activation energy. Therefore, still another parameter, that is, activation energy Ea is added. However, although the parameter changes in only a different process (step), it does not change in a bias condition. Accordingly, it is possible to process the data as the total constant that are not necessary to be separately extracted per cell and load condition That is, the process is performed in the stage shown by a broken line in the above-described FIG. 9. Also, in this case, this is contrary to the technologies described in Japanese Patent Laid-Open Nos. 135388/1999 and 219380/1999. Because, in the latter case, a delay library dependent on temperature is re-constructed and is stored in the form of a table.

4-2. Case Where a Power Supply Fluctuation is Added

Where power supply fluctuations are added, the power supply fluctuations can be included in the parameters Ac and β. Basically, they can be expressed by:

$$Ac = \{Ac0 \times \exp(BB/Vcc)\}^{-n} \quad \text{Equation 10}$$

or $$\beta = -n \times \{\beta 0 + (BB/Vds) \times \log(e)\} \quad \text{Equation 11}$$

where β0=log(Ac0). In this case, the parameter BB changes by only the process (Step). It does not change by the bias, signal and load conditions. Therefore, the parameter can be stored in one place applicable to all the cells like Ea in the case of temperature. In this case, the situation is contrary to the technologies described in Japanese Patent Laid-Open Nos. 135388/1999 and 219380/1999, described above, for which the delay library must be re-calculated.

4-3. Circuit Operating Time and Actions Due to Degradation Level Changes

Figure 34:
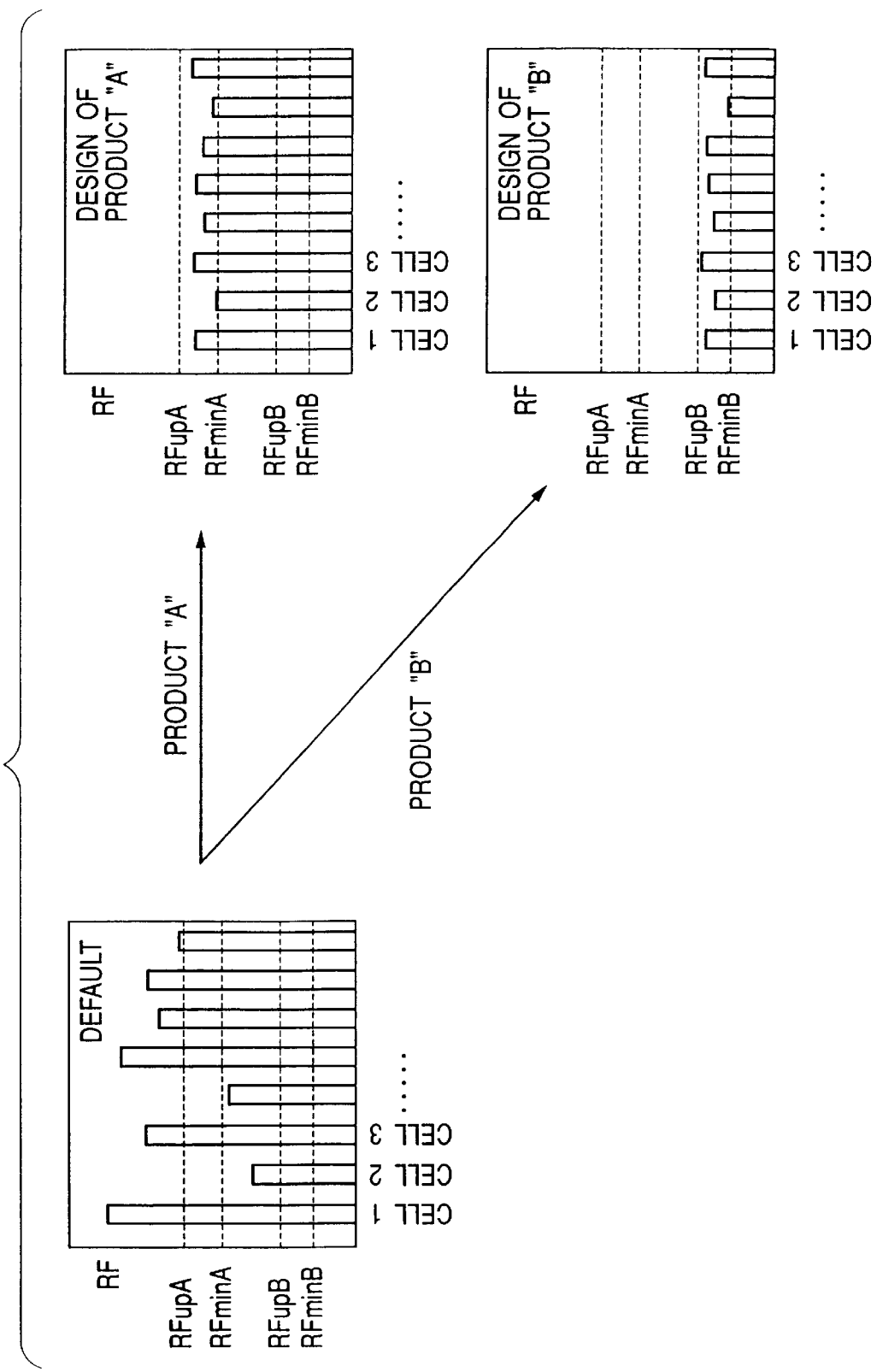
FIG. 34 is a view explaining a change in the reliability factor RF of products A and B whose validity differ from each other, in one embodiment according to the invention.
Figure 35:
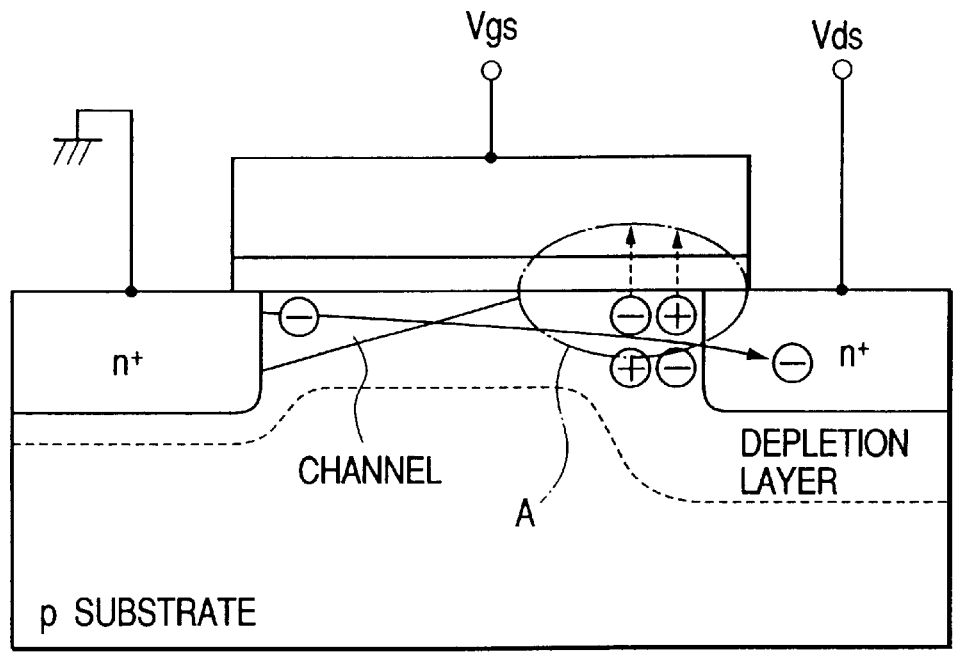
FIG. 35 is a view explaining a saturation mode (Vds>Vdsat) a MOSFET transistor operation as the premise of the invention.
Figure 36:
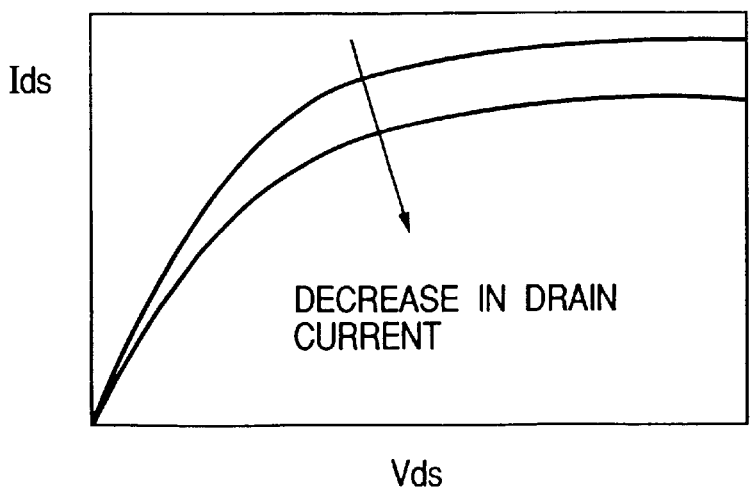
FIG. 36 is a characteristic view showing a decrease in the drain current of the transistor operation as the premise of the invention.
Figure 37:
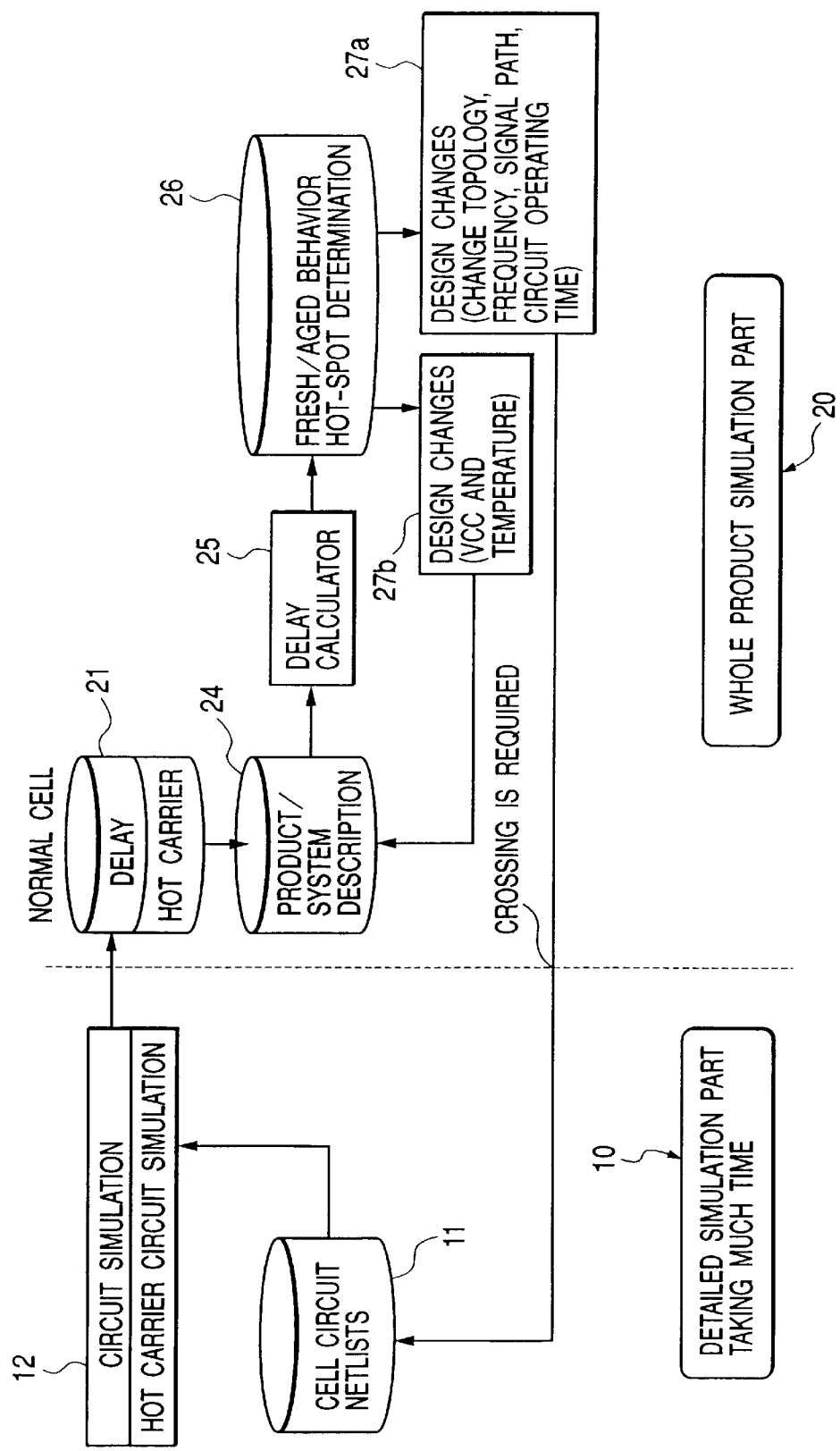
FIG. 37 is a functional block diagram showing a design system of a semiconductor integrated circuit device as the premise of the invention.

FIG. 34 is a view explaining the actions of changing the circuit operating time and degradation level, which is a view showing changes in the reliability factor RF of products "A" and "B" whose validity terms are different from each other (This drawing is similar to the above-described FIG. 17).

With respect to the actions of changing the circuit operating time and degradation level, the above-described FIG. 17 and FIG. 18 showed the process of adjusting all the cells so that the reliability factor RF thereof lies between the minimum reliability factor RFmin and the maximum reliability factor RFup, which are a certain range. However, if the following situation occurs, the values of RFmin and RFup can be varied.

If the validity term of a product is shorter or longer than the first-presumed value, the RF limits (RFmin and RFup) are, respectively, made larger or smaller. For example, as regards the product "A", it is assumed that the performance degradation standard is 10% speed delay, the validity term of the product is ten years, and RFmin and RFup of the product are expressed in terms of RFminA and RFupA as in FIG. 34. On the other hand, in the same process, it is assumed that there is a product "B" whose validity term is three years. This means that the product "B" is permitted to accept 10% degradation for three years and this also means that RFminB and RFupB are, respectively, smaller than RFminA and RFupA (That is, RFminB<RFminA, and RFupB<RFupA). This is because the product "B" allows larger degradation than in the product "A". This is indicated by a downward displacement of the line of RFmin and RFup in FIG. 34.

The same thing can be said in connection to the degradation level. For example, if the product "B" allows a 20% speed degradation although both the products "A" and "B" have a validity term of ten years, RFminB<RFminA and RFupB<RFupA are secured. In this case, the product "B" allows a larger degradation than in the product "A". Therefore, it is possible that the reliability factor RF of the product "B" is made smaller.

In the delay libraries according to the invention, the simulations of the above-described two cases (further, modification of operation frequencies equivalent to the change of the operating time) can be carried out without requiring any re-synthesization of the whole delay libraries, which will be needed in the technologies described in the above-described Japanese Patent Laid-Open Nos. 135388/1999 and 219380/1999.

Therefore, according to the design system of a semiconductor integrated circuit device of the present embodiment, since hot carrier information is included in the delay libraries, only a single delay library is needed to predict new hot carrier degradation performance, and the hot carrier degradation performance with respect to the actual operating time of any one of the circuits can be predicted by using only a single delay library.

As described above, a detailed description was given of the invention made by the present inventor on the basis of its preferred embodiment. However, the invention is not limited to the above-described embodiment, and it is needless to say that the invention may be subject to various modifications unless otherwise it departs from the spirit of the invention. For example, the features brought about by the invention are effective if the invention is applied to logic products using cell libraries in the product design. Furthermore, it is widely applicable to all digital products.

Effects that can be obtained by a representative example of the invention disclosed by the embodiment are described below:

(1) Since parameters describing the time dependence of degradation are included in delay libraries, it becomes possible that a library required to describe the degradation with respect to different circuit operating times is only a single delay library.

(2) Since parameters describing the time dependence of degradation are included in delay libraries, it becomes possible that a library required to describe the degradation in various types of frequencies is only a single delay library.

(3) The delay library and hot carrier library are combined, and only one library is needed.

(4) Since the hot carrier degradation in the level of circuits need not be repeated with respect to different circuit operating time or frequencies by the above-described (1) through (3), it is possible to prepare only a single library per technology to completely characterize the hot carrier degradation.

(5) In a designing method of a semiconductor integrated circuit device that accepts reliability in the design and optimizes the reliability and performance, crossing between the time-consuming detailed simulation part (that takes much time) and the fast whole-production simulation part is not required due to the above-described (1) through (4). The whole design optimization will be able to be executed at the fast whole-product simulation part.

(6) In a designing method of a semiconductor integrated circuit device that accepts reliability in the design and optimizes the reliability and performance, the reliability factor of logic cells, having a higher reliability than necessary, of respective cells that constitute a logic product, is reduced so that the reliability factor is placed within a predetermined margin, and the reliability factor of the logic cells that do not meet the reliability requirement is increased so that the reliability can be placed within a certain margin, whereby it will becomes possible to reduce the chip size while maintaining the reliability.

What is claimed is:

1. A computer-readable storage medium stored with a delay library of at least one logic cell constituting at least a part of a logic product, said delay library including:

at least one input signal transition time applicable to said logic cell;

at least one output capacitance applicable to said logic cell;

at least one hot carrier degradation parameter corresponding to said input signal transition time and said output capacitance, said parameter being determined by a transient bias voltage to be applied to said logic cell and a circuit configuration of said logic cell; and a degradation simulation function calculating an age dependent change of a delay time of said logic cell being expressed as an exponential function of said hot carrier degradation parameter with a simulated age of said logic cell as a base when said input signal transition time and said output capacitance are applied to said logic cell.

2. The computer-readable storage medium according to claim 1, wherein a degradation of said logic cell D due to age dependence of the delay time of said logic cell is expressed by two hot carrier degradation parameters Ac and n as D=$\Delta$ tp/tp0 =Ac$\times t^n$, where t is a simulated age of said logic cell, tp0 is a fresh delay quantity of said logic cell, and $\Delta$tp is an aged delay quantity of said logic cell, wherein said Ac is a parameter dependent on a circuit configuration of said logic cell and a bias voltage that said logic cell receives, and said n is a slope of age dependence of a delay time of said logic cell and is a parameter that is dependent on said circuit configuration and bias voltage that said logic cell receives.

3. The computer-readable storage medium according to claim 2, wherein said delay library includes an output signal rise propagation delay of said logic cell, and an output signal fall propagation delay thereof.

4. The computer-readable storage medium according to claim 3, wherein said delay library further includes an output signal rise transition time of said logic cell and an output signal fall transition time thereof.

5. The computer-readable storage medium according to claim 4, wherein said delay library is expressed in the form of a table.

6. The computer-readable storage medium according to claim 1, wherein, when duty Dt and frequency f are taken into account, the degradation D due to the age dependence of the delay time of said logic cell is expressed by two hot carrier degradation parameters $\beta$ and n as $$D=Ac \times (Dt \times f/f0 \times t)^n = Bc(Dt \times f \times t)^n,$$

$Bc=Ac/f0^n$, when $f0=Ac$ and n are extracted, and where a logarithm of both the sides is taken, $$\log(D)=\log(Bc)+n\log(Dt \times f \times t)$$

or $\log D = \beta + n\log(Dt \times f \times t)$ or $\text{Log}D = \log(D) = \beta + n\text{Log}f + n\text{Log}t + n\text{Log}Dt, \text{Log}Dt = \log(Dt)$;

where said Logf is a logarithm of the frequency f, and said Logt is a logarithm of a simulated age of said logic cell t, said Ac is a parameter dependent on a circuit configuration of said logic cell and a bias voltage that said logic cell receives, and said n is a slope of age dependence of a delay time of said logic cell and is a parameter that is dependent on said circuit configuration and bias voltage that said logic cell receives.

7. The computer-readable storage medium according to claim 6, wherein said delay library further includes a propagation delay when an output signal of said logic cell rises, and a propagation delay when the output signal falls.

8. The computer-readable storage medium according to claim 7, wherein said delay library further includes an output signal rise transition time of said logic cell and an output signal fall transition time thereof.

9. The computer-readable storage medium according to claim 8, wherein said delay library is expressed in the form of a table.

10. A computer-readable storage medium stored with a delay library of logic cells constituting a semiconductor integrated circuit device, wherein said delay library including:

a critical path of said semiconductor integrated circuit device composed of some of said logical cells;

a plurality of input signal transition times applicable to said logic cells;

a plurality of output capacitances applicable to said logic cells;

at least one hot carrier degradation parameter corresponding to one of said input signal transition time and one of said output capacitance, said parameter being determined by a transient bias voltage to be applied to a corresponding logic cell and a circuit configuration of said logic cell; and a degradation simulation function for calculating an age dependent change of a delay time of said logic cell being expressed as an exponential function of said hot carrier degradation parameter with a simulated age of said logic cell as a base, when one of said plurality of input signal transition times and one of said plurality of output capacitances are given said logic cell.

11. The computer-readable storage medium according to claim 10, wherein said delay library includes parameters used when calculating the input signal transition times of a plurality of logic cells different from each other, output capacitance of logic cells thereof, and aged changes of the delay time of the logic cells.

12. The computer-readable storage medium according to claim 10, wherein a degradation of said logic cell D due to age dependence of the delay time of said logic cell is expressed by two hot carrier degradation parameters Ac and n as $D=\Delta tp/tp0=Ac \times t^n$, where t is a simulated age of said logic cell, tp0 is a fresh delay quantity of said logic cell, and $\Delta tp$ is an aged delay quantity of said logic cell, wherein said Ac is a parameter dependent on a circuit configuration of said logic cell and a bias voltage that said logic cell receives, and said n is a slope of age dependence of a delay time of said logic cell and is a parameter that is dependent on said circuit configuration and bias voltage that said logic cell receives.

13. The computer-readable storage medium according to claim 10, wherein, when duty Dt and frequency f are taken into account, the degradation D due to the age dependence of the delay time of said logic cell is expressed by two hot carrier degradation parameters $\beta$ and n as $$D=Ac \times (Dt \times f/f0 \times t)^n = Bc(Dt \times f \times t)^n,$$

$Bc=Ac/f0^n$, when $f0=Ac$ and n are extracted, and where a logarithm of both the sides is taken, $$\log(D)=\log(Bc)+n\log(Dt \times f \times t)$$

or $\log D = \beta + n\log(Dt \times f \times t)$ or $\text{Log}D = \log(D) = \beta + n\text{Log}f + n\text{Log}t + n\text{Log}Dt, \text{Log}Dt = \log(Dt)$;

where said Logf is a logarithm of the frequency f, and said Logt is a logarithm of a simulated age of said logic cell t, said Ac is a parameter dependent on a circuit configuration of said logic cell and a bias voltage that said logic cell receives, and said n is a slope of age dependence of a delay time of said logic cell and is a parameter that is dependent on said circuit configuration and bias voltage that said logic cell receives.

* * * * *